(12) United States Patent
Yajima et al.

(10) Patent No.: US 7,708,618 B2
(45) Date of Patent: May 4, 2010

(54) METHOD AND APPARATUS FOR DRY-IN, DRY-OUT POLISHING AND WASHING OF A SEMICONDUCTOR DEVICE

(75) Inventors: Hiromi Yajima, Yokohama (JP); Yukio Imoto, Zama (JP); Shoichi Kodama, Shinagawa-ku (JP); Riichiro Aoki, Adachi-ku (JP); Takashi Omichi, Fujisawa (JP); Toyomi Nishi, Tokyo (JP); Tetsuji Togawa, Tokyo (JP)

(73) Assignees: Ebara Corporation, Tokyo (JP); Kabushiki Kaisha Toshiba, Kanagawa-ken (JP)

( * ) Notice: Subject to any disclaimer, the term of this patent is extended or adjusted under 35 U.S.C. 154(b) by 96 days.

(21) Appl. No.: 11/980,667

(22) Filed: Oct. 31, 2007

(65) Prior Publication Data

US 2008/0166949 A1 Jul. 10, 2008

Related U.S. Application Data

(60) Division of application No. 11/221,924, filed on Sep. 9, 2005, now abandoned, which is a division of application No. 10/372,224, filed on Feb. 25, 2003, now Pat. No. 6,966,821, which is a division of application No. 09/804,232, filed on Mar. 13, 2001, now Pat. No. 6,547,638, which is a continuation of application No. 09/233,039, filed on Jan. 20, 1999, now Pat. No. 6,273,802, which is a division of application No. 08/767,060, filed on Dec. 16, 1996, now Pat. No. 5,885,138, which is a continuation-in-part of application No. 08/309,193, filed on Sep. 20, 1994, now Pat. No. 5,616,063, and a continuation-in-part of application No. 08/563,295, filed on Nov. 28, 1995, now Pat. No. 5,679,059, and a continuation-in-part of application No. 08/580,312, filed on Dec. 28, 1995, now Pat. No. 5,827,110.

(30) Foreign Application Priority Data

| Sep. 21, 1993 | (JP) | 1993-259396 |
| Nov. 29, 1994 | (JP) | 1994-319289 |
| Dec. 6, 1994 | (JP) | 1994-330209 |
| Dec. 6, 1994 | (JP) | 1994-330210 |
| Dec. 28, 1994 | (JP) | 1994-339165 |
| Dec. 28, 1994 | (JP) | 1994-339166 |
| Dec. 28, 1994 | (JP) | 1994-339167 |

(51) Int. Cl.
*B24B 51/00* (2006.01)

(52) U.S. Cl. .............................. 451/5; 451/67; 451/287

(58) Field of Classification Search ......... 451/285–290, 451/5, 41, 54, 67
See application file for complete search history.

(56) References Cited

U.S. PATENT DOCUMENTS 3,807,098 A * 4/1974 Schaller et al. ................ 451/5

(Continued)

FOREIGN PATENT DOCUMENTS

FR 2505712 1/1985

(Continued)

OTHER PUBLICATIONS

Patent Abstracts of Japan, vol. 12, No. 485(mm-777), Dec. 19, 1988.

(Continued)

*Primary Examiner*—Hadi Shakeri
(74) *Attorney, Agent, or Firm*—Wenderoth, Lind & Ponack, L.L.P.

(57) ABSTRACT

A polishing apparatus includes an arrangement of a plurality of units to deal with various operations and a robot having at least one arm. The plurality of units are disposed around the robot and include a loading unit for receiving thereon a, e.g. dry, workpiece to be polished, a polishing system including at least one polishing unit for polishing the workpiece, a washing system and a drying system at least including one washing unit for washing and drying the polished workpiece, and an unloading unit for receiving thereon a resultant clean and dry polished workpiece.

6 Claims, 18 Drawing Sheets

U.S. PATENT DOCUMENTS

| | | | |
|---|---|---|---|
| 4,020,600 A | 5/1977 | Day | |
| 4,050,954 A | 9/1977 | Basi | |
| 4,141,180 A | 2/1979 | Gill, Jr. et al. | |
| 4,193,226 A | 3/1980 | Gill, Jr. et al. | |
| 4,313,266 A | 2/1982 | Tam | |
| 4,502,252 A | 3/1985 | Iwabuchi | |
| 4,653,231 A | 3/1987 | Cronkhite et al. | |
| 4,680,893 A | 7/1987 | Cronkhite et al. | |
| 4,838,150 A | 6/1989 | Suzuki et al. | |
| 4,851,101 A | 7/1989 | Hutchinson | |
| 4,886,529 A * | 12/1989 | Hashimoto et al. | 451/5 |
| 4,905,425 A | 3/1990 | Sekigawa et al. | |
| 4,956,944 A | 9/1990 | Ando et al. | |
| 4,984,392 A | 1/1991 | Sekigawa et al. | |
| 5,094,037 A | 3/1992 | Hakomori et al. | |
| 5,096,477 A | 3/1992 | Shinoda et al. | |
| 5,140,774 A | 8/1992 | Onodera | |
| 5,174,067 A | 12/1992 | Hasegawa et al. | |
| 5,213,118 A | 5/1993 | Kamikawa | |
| 5,254,205 A | 10/1993 | Tsutsumi et al. | |
| 5,299,584 A | 4/1994 | Miyazaki et al. | |
| 5,329,732 A | 7/1994 | Karlsrud et al. | |
| 5,333,413 A | 8/1994 | Hashimoto | |
| 5,351,360 A | 10/1994 | Suzuki et al. | |
| 5,361,545 A | 11/1994 | Nakamura | |
| 5,421,768 A | 6/1995 | Fujiwara et al. | |
| 5,425,793 A | 6/1995 | Mori et al. | |
| 5,431,600 A | 7/1995 | Murata et al. | |
| 5,456,627 A | 10/1995 | Jackson et al. | |
| 5,498,199 A * | 3/1996 | Karlsrud et al. | 451/289 |
| 5,498,294 A | 3/1996 | Matsushita et al. | |
| 5,518,542 A | 5/1996 | Matsukawa et al. | |
| 5,582,534 A | 12/1996 | Shendon et al. | |
| 5,616,063 A | 4/1997 | Okumura et al. | |
| 5,618,227 A | 4/1997 | Tsutsumi et al. | |
| 5,655,954 A | 8/1997 | Oishi et al. | |
| 5,679,060 A | 10/1997 | Leonard et al. | |
| 5,738,574 A | 4/1998 | Tolles et al. | |
| 5,779,520 A | 7/1998 | Hayakawa | |
| 5,885,138 A | 3/1999 | Okumura et al. | |
| 6,110,011 A | 8/2000 | Somekh et al. | |
| 6,213,853 B1 | 4/2001 | Gonzalez-Martin et al. | |
| 6,425,806 B2 | 7/2002 | Okumura et al. | |
| 6,439,971 B2 | 8/2002 | Okumura et al. | |
| 6,443,808 B2 | 9/2002 | Okumura et al. | |

FOREIGN PATENT DOCUMENTS

| | | |
|---|---|---|
| JP | 57-48472 | 3/1982 |
| JP | 58-223561 | 12/1983 |
| JP | 59-19671 | 2/1984 |
| JP | 60-8189 | 3/1985 |
| JP | 61-152357 | 7/1986 |
| JP | 63-207559 | 8/1988 |
| JP | 4-334025 | 11/1992 |
| JP | 5-152262 | 6/1993 |
| JP | 6-99348 | 4/1994 |
| JP | 6-252110 | 9/1994 |

OTHER PUBLICATIONS

Patent Abstracts of Japan, vol. 8, No. 80 (M-289), Apr. 12, 1994.

"Planarization by Chemical-Mechanical Polishing for Multilevel Metal Integrated Circuits", William C. O'Mara, 1994, pp. 37, 62-64.

* cited by examiner

F I G. 1
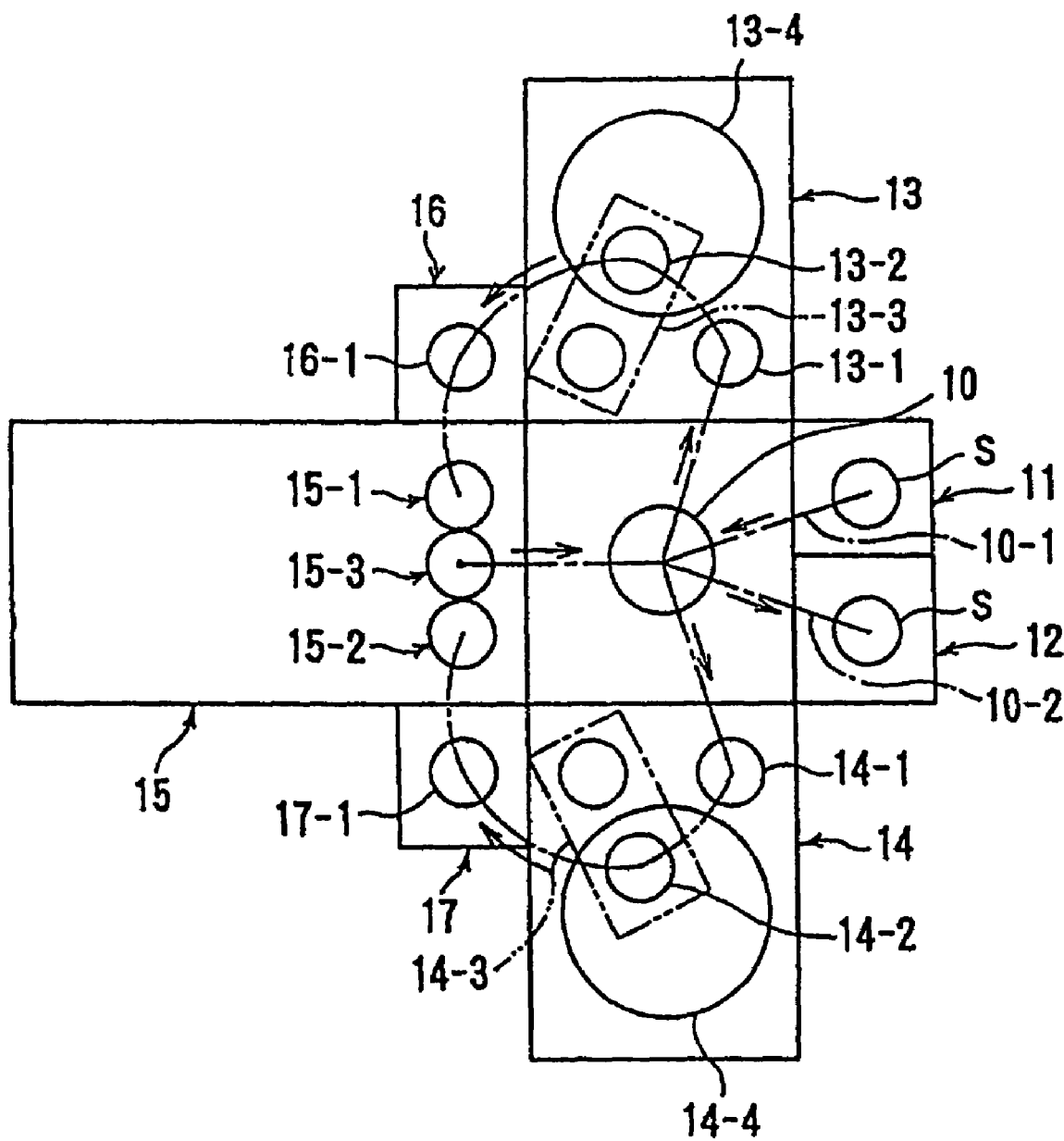

F I G. 3
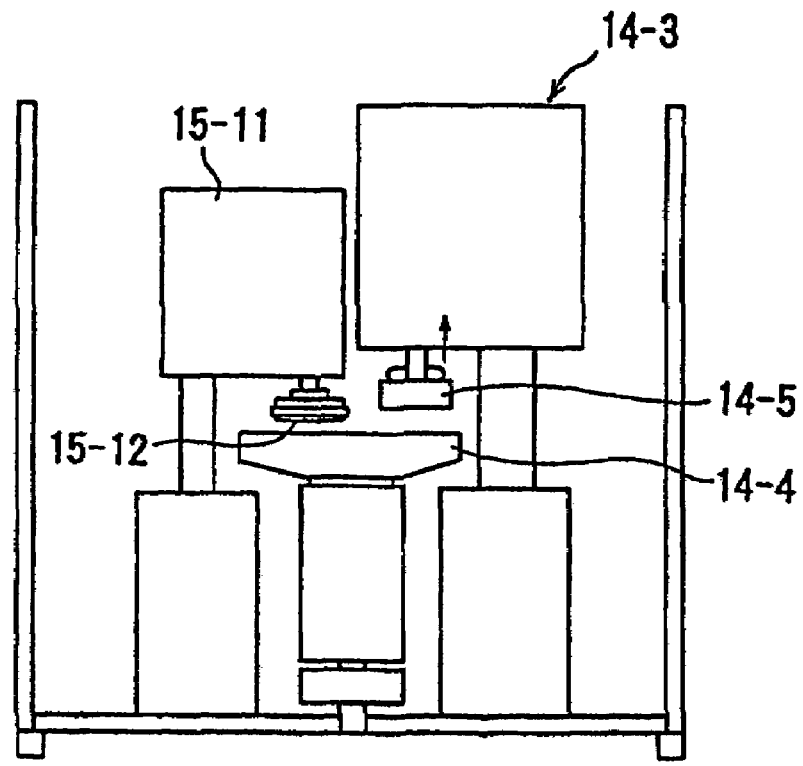
F I G. 4
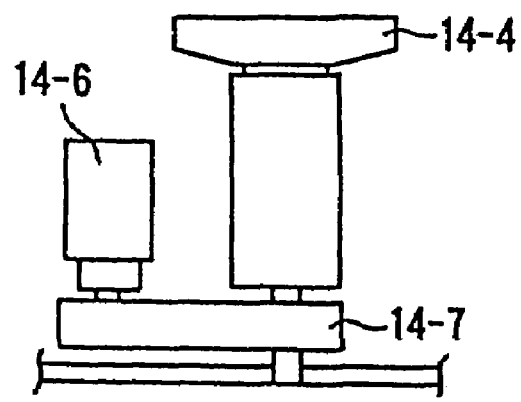

F I G. 6
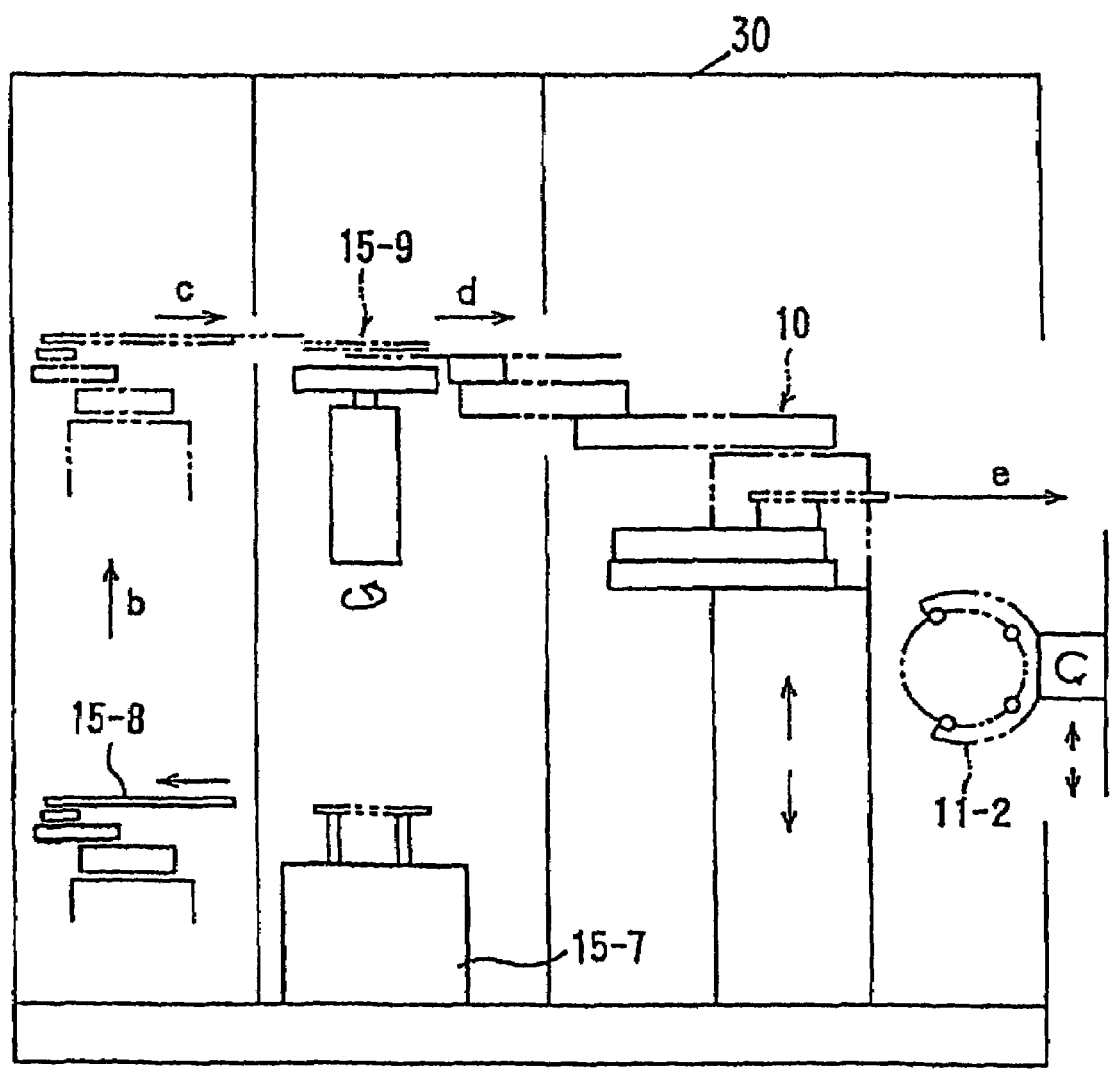

F I G. 7
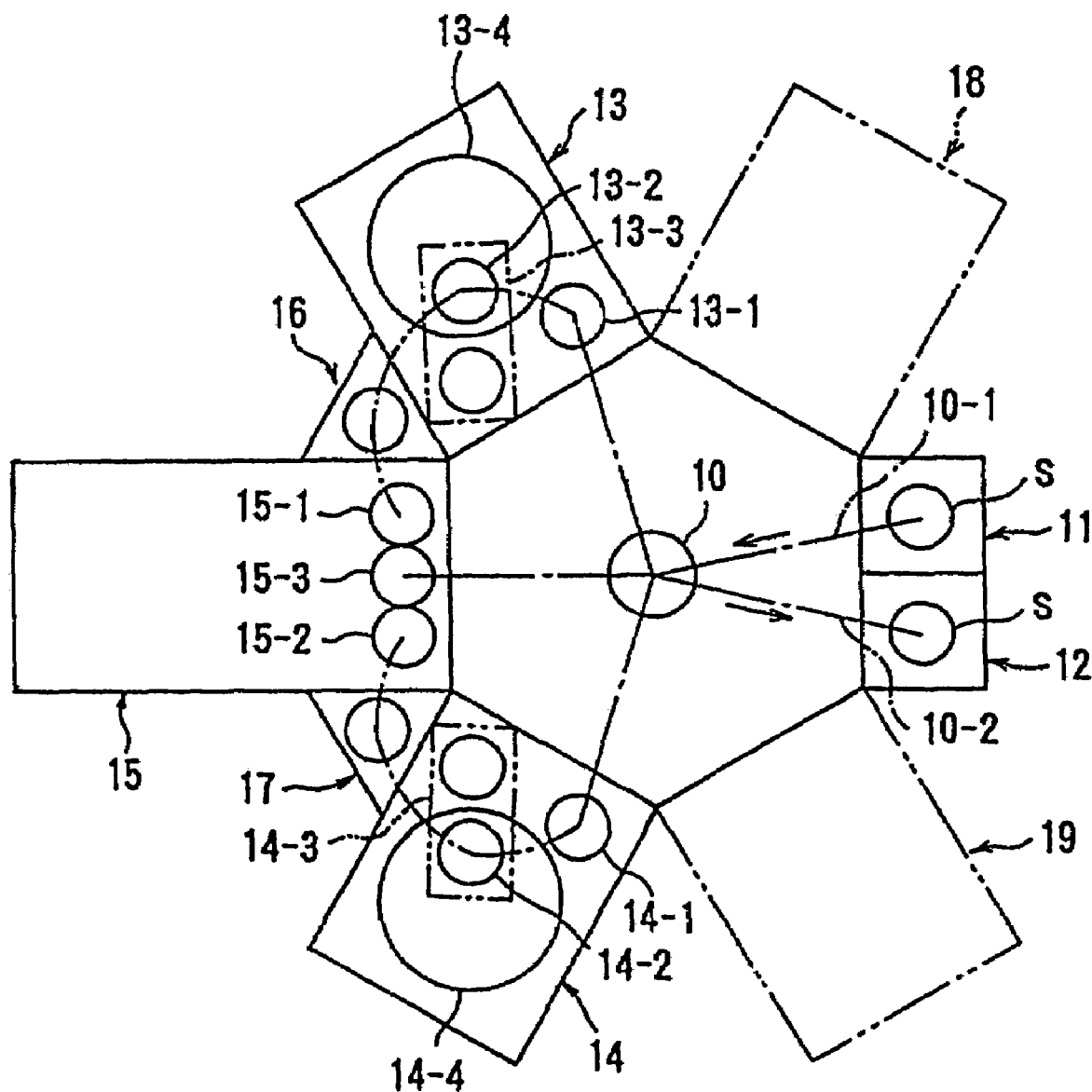

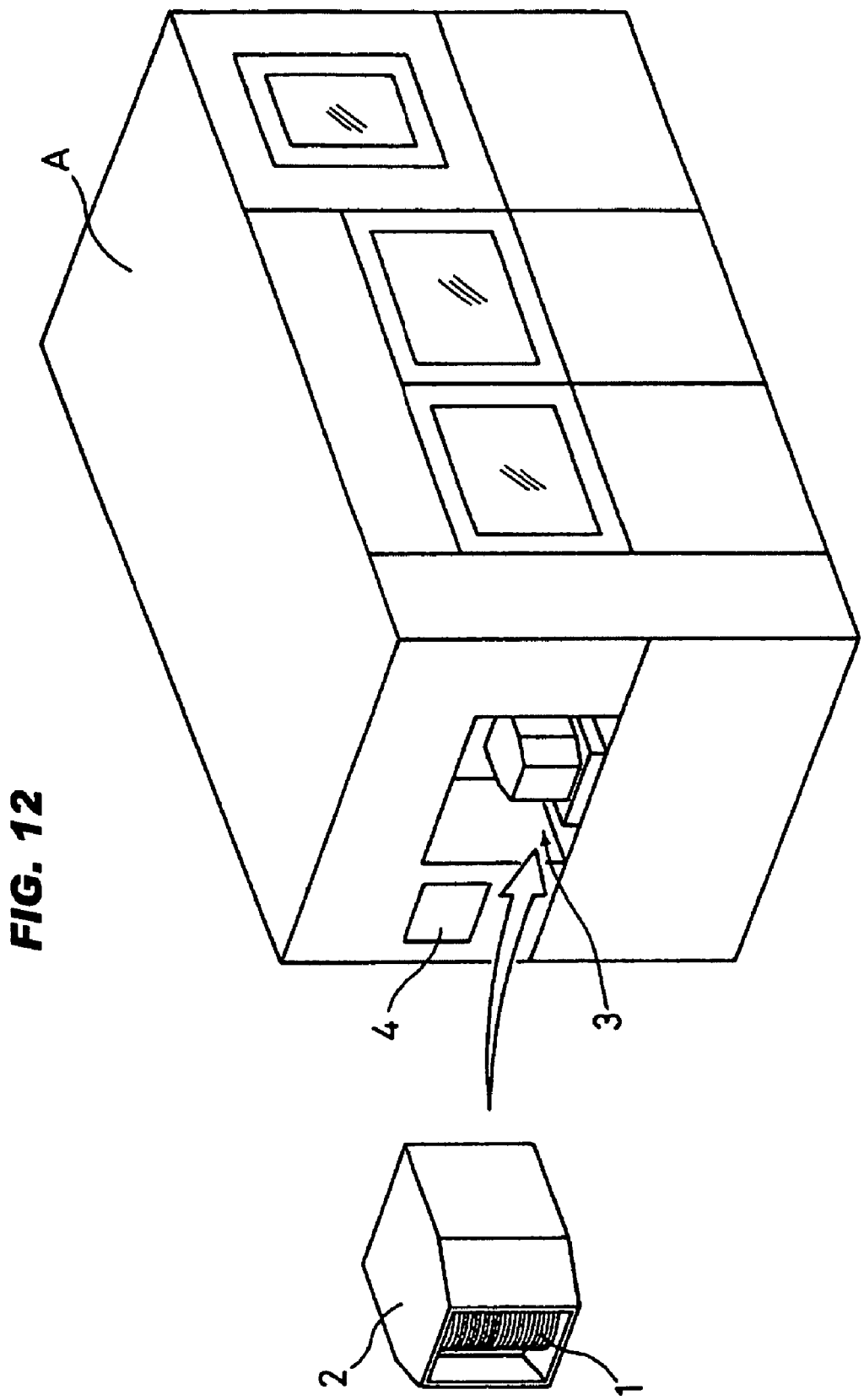

METHOD AND APPARATUS FOR DRY-IN, DRY-OUT POLISHING AND WASHING OF A SEMICONDUCTOR DEVICE

This is a division of U.S. patent application Ser. No. 11/221,924, filed Sep. 9, 2005, now abandoned which is a divisional of U.S. patent application Ser. No. 10/372,224, filed Feb. 25, 2003, now U.S. Pat. No. 6,966,821, which is a divisional application of U.S. patent application Ser. No. 09/804,232, filed Mar. 13, 2001, now U.S. Pat. No. 6,547,638, which is a continuation of U.S. patent application Ser. No. 09/233,039, filed Jan. 20, 1999, now U.S. Pat. No. 6,273,802, which is a division of application Ser. No. 08/767,060, filed Dec. 16, 1996, now U.S. Pat. No. 5,885,138, which is a Continuation-In-Part of application Ser. No. 08/309,193, filed Sep. 20, 1994, now U.S. Pat. No. 5,616,063, of application Ser. No. 08/563,295, filed Nov. 28, 1995, now U.S. Pat. No. 5,679,059, and of application Ser. No. 08/580,312, filed Dec. 28, 1995, now U.S. Pat. No. 5,827,110.

BACKGROUND OF THE INVENTION

1. Field of the Invention

The present invention relates to a polishing method and apparatus, and more particularly to such a method and apparatus for polishing a workpiece such as a semiconductor wafer. Further particularly, the present invention relates to such a method and apparatus wherein a workpiece to be polished and washed, particularly a dry workpiece, is loaded into the apparatus, is polished and then washed and dried therein, and wherein the resultant clean and dry polished workpiece is transferred from the apparatus. When a dry workpiece to be polished is loaded into the apparatus and a clean and dry polished workpiece is transferred from the apparatus, the method is referred to hereinafter as a "dry-in, dry-out" method. Still further particularly, the present invention relates to such a "dry-in, dry-out" method and apparatus including a plurality of operating units disposed in an array or cluster around at least one center robot having at least one robot arm, and having a transfer structure including separate and discrete transfer mechanisms including at least one first transfer mechanism for transferring a dry workpiece into the apparatus and for transferring the clean and dry polished workpiece from the apparatus, and at least one second transfer mechanism for transferring the workpiece between polishing and washing units of the apparatus.

2. Description of Related Art

Recent rapid progress in semiconductor device integration demands smaller and smaller wiring patterns or interconnections and also narrower spaces between interconnections which connect active areas. One of the processes available for forming such interconnections is photolithography. Although a photolithographic process can form interconnections that are at most 0.5 μm wide, such process requires that surfaces on which pattern images are to be focused by a stepper be as flat as possible because the depth of focus of the optical system is relatively small.

It is therefore necessary to make the surfaces of semiconductor wafers flat to enable use of photolithography. One customary way of flattening the surfaces of semiconductor wafers is to polish them with a polishing apparatus.

Conventionally, such a polishing apparatus has a single function of polishing a semiconductor wafer. Therefore, in the case of washing a semiconductor wafer after polishing, the semiconductor wafer must be transferred or transported from the polishing apparatus to a washing apparatus. Further, in the case of polishing a semiconductor wafer again under different conditions after a first polishing operation, the semiconductor wafer must be transferred or transported from one polishing apparatus to another polishing apparatus. In such cases, the semiconductor wafers are manually transferred or transported by a movable container in which they are immersed in water to keep them from drying during transportation. However, since various apparatuses including a polishing apparatus and a washing apparatus are independently installed and the semiconductor wafers are transferred or transported by the movable container containing water therein, it is difficult to install the polishing apparatus, the washing apparatus and the like in a clean room of a semiconductor manufacturing plant and to automate completely various processes including a polishing process and a washing process.

In order to solve the above problems, there has been proposed an apparatus which has a polishing unit and a washing unit provided in a common housing. Further, if necessary, a plurality of polishing units can be provided in a common housing. In a polishing apparatus which has a polishing unit and a washing unit, or a plurality of polishing units in a common housing, it is conceivable to construct a cluster type of polishing apparatus which integrates a plurality of units including a polishing unit and a washing unit, as employed in a semiconductor manufacturing process such as etching or chemical vapor deposition (CVD).

However, in the case of constructing a cluster type of polishing apparatus which integrates a plurality of units and incorporates a universal transfer robot at a central position of the units, it is necessary to handle both a dirty and wet semiconductor wafer soiled with abrasive slurry or particles generated by the polishing operation and a clean and dry semiconductor wafer which is placed on a loading unit or an unloading unit. Therefore, a conventional robot incorporated in a cluster type of a semiconductor manufacturing processing apparatus cannot be used in a cluster type of polishing apparatus because such robot is not capable of handling separately both a clean semiconductor wafer and a dirty semiconductor wafer. If such conventional robot is incorporated into the polishing apparatus, a washing process and a drying process of the robot or a robot arm additionally are required, thus lowering throughput efficiency of the apparatus. Further, when such robot or the robot arm is left for a long time as it is, abrasive material or particles generated by the polishing operation adhere to the robot or the robot arm, resulting in contamination of subsequent semiconductor wafers or respective units of the polishing apparatus.

SUMMARY OF THE INVENTION

Therefore, it is an object of the present invention to provide an improved polishing method and apparatus wherein it is possible to achieve polishing of a workpiece and then to achieve washing and drying of the workpiece.

It is a further object of the present invention to provide such a method and apparatus wherein workpieces to be polished that are introduced to the apparatus are dry and wherein polished and cleaned workpieces that are discharged from the apparatus also are dry, wherein the method and apparatus operate according to a dry-in, dry-out principle.

It is a yet further object of the present invention to provide such a method and apparatus wherein it is possible to overcome the above discussed and other prior art disadvantages and to provide a much greater degree of manufacturing flexibility than has been possible in the prior art.

It is an even still further object of the present invention to provide such a polishing method and apparatus employing a cluster type arrangement of a plurality of units that perform various operations, as well as a transfer structure including exclusive means for handling a clean semiconductor wafer and exclusive means for handling a dirty semiconductor wafer. Thus, a transfer mechanism or mechanisms that handle a dry semiconductor wafer to be loaded into the apparatus and that handle a clean and dry semiconductor wafer that has been polished and then washed and dried and that is discharged from the apparatus are exclusive, discrete and separate from a transfer mechanism or mechanisms that transfer semiconductor wafers among polishing and washing systems of the apparatus. Thus, dry semiconductor wafers are loaded into the apparatus, and dry semiconductor wafers that have been polished and washed are transferred from the apparatus.

In accordance with one aspect of the present invention, there is provided a method and apparatus wherein a workpiece to be polished is transferred from a loading unit to a polishing system, whereat the workpiece is polished to form a polished workpiece. The polished workpiece is transferred from the polishing unit to a washing unit defining washing and drying systems. The workpiece is washed and then dried at the washing unit to form a clean and dry polished workpiece. The thus clean and dry polished workpiece then is transferred from the washing unit to an unloading unit. In accordance with a further feature of the present invention, the workpiece to be polished is transferred in a dry condition from the loading unit to the polishing unit.

According to another aspect of the present invention, there is provided a polishing method and apparatus for polishing a surface of a workpiece and washing the workpiece which has been polished. A universal transfer robot has at least one arm for transferring the workpiece. A plurality of units are disposed around the universal transfer robot and include a loading unit for receiving thereon the dry workpiece to be polished, a polishing system including at least one polishing unit for polishing the workpiece which is transferred from the loading unit, a washing system and a drying system defined by at least one washing unit for washing and drying the workpiece which has been polished and an unloading unit for receiving thereon the resultant washed and dried polished workpiece. A transfer structure includes an exclusive transfer mechanism that transfers a clean workpiece and another exclusive transfer mechanism that transfers a dirty workpiece. The loading unit, the unloading unit, the polishing unit and the washing unit are disposed around the universal transfer robot. A workpiece, i.e. a dry workpiece, is picked up from the loading unit by the universal transfer robot, transferred to the polishing unit, and polished by the polishing unit. After the polishing operation, the thus dirty workpiece is transferred from the polishing unit to the washing unit by another exclusive transfer mechanism and is washed and dried by the washing unit. After such washing and drying operations, the resultant clean and dry polished workpiece is transferred from the washing unit to the unloading unit by the universal transfer robot.

According to a further aspect of the present invention, the universal transfer robot has an arm for exclusively handling a clean workpiece and an arm for exclusively handling a dirty workpiece. The loading unit, the unloading unit, the polishing unit and the washing unit are disposed around the universal transfer robot. A workpiece, e.g. a dry workpiece, is picked up from the loading unit by the arm for exclusively handling a clean workpiece of the universal transfer robot, transferred to the polishing unit, and polished by the polishing unit. After such polishing operation, the thus dirty workpiece is transferred from the polishing unit to the washing unit by the arm for exclusively handling a dirty workpiece of the universal transfer robot, and is washed and dried by the washing unit. After such washing and drying operations, the resultant clean and dry polished workpiece is transferred from the washing unit to the unloading unit by the arm for exclusively handling a clean workpiece of the universal transfer robot.

According to a still further aspect of the present invention, the transfer structure includes two universal transfer robots each having at least one arm for transferring the workpiece, and the plurality of units are disposed around the two universal transfer robots. One of the universal transfer robots transfers a clean workpiece and the other of the universal transfer robots transfers a dirty workpiece. The loading unit, the unloading unit, the polishing unit and the washing unit are disposed around the two universal transfer robots. A workpiece, e.g. a dry workpiece, is picked up from the loading unit by the universal transfer robot for exclusively handling a clean workpiece, transferred to the polishing unit, and polished by the polishing unit. After such polishing operation, the thus dirty workpiece is transferred from the polishing unit to the washing unit by the universal transfer robot for exclusively handling a dirty workpiece, and is washed and dried by the washing unit. After such washing and drying operations, the resultant clean and dry polished clean workpiece is transferred from the washing unit to the unloading unit by the universal transfer robot for exclusively handling a clean workpiece.

It is a further object of the present invention to provide a polishing facility having high productivity, adaptability to upgrading, ease of maintenance and adaptability to user needs. Another object is to provide polishing facility having a control unit suitable for use with block-based polishing operation as well as having monitoring capability for ancillary devices.

The object has been achieved in a polishing facility comprising functional blocks, i.e., a first functional block relating to an load/unload function block for delivery of cassette storing wafers; a second relating to a transport function block for moving wafers; a third relating to a polishing function block for polishing of wafers; a fourth relating to a cleaning function block for cleaning wafers; and a fifth relating to a control function block for controlling the polishing facility.

The advantage of providing separate functional blocks is that each block can be standardized, and the efficiency of manufacturing a polishing facility is improved because of lower manufacturing cost as well as shorter delivery schedules.

Another advantage is that when upgrading is required, the facility can be improved by exchanging or modifying only that functional block which requires attention. The facility is thus adaptable to upgrading needs of the operation at low cost.

The facility is designed to be flexible to permit relocation of any functional blocks to meet customer requirements.

In another aspect of the facility, the five functional blocks are arrangeable free of inter-block configuration; if upgrading is required on any of the blocks, individual blocks can be replaced or repaired, thus enabling to upgrade the performance at low cost. The facility therefore provides high adaptability to future expansion and improvements. The facility can be maintained efficiently, because if a repair is needed, disassembly is minimal and dust generation is kept low.

In another aspect of the facility, each block may comprise a plurality of sub-blocks performing the same function. The layout of the blocks can be changed to meet any space allowance dictated by individual needs of the user.

In an another version of the polishing facility, each of the load/unload function block, transport function block, polishing function block and cleaning function block is provided with a driver for driving a motor, an electrical terminal for supplying electrical power to the driver, a control valve for controlling operations of an air cylinder and process valves, air supply provisions for supplying air to the control valves, a conversion interface for control signals for the driver and the control valves, as well as a communications terminal for receiving control signals. The control function block is provided with a power source for supplying electrical power to each of the blocks through an electrical terminal; a computer for generating command signals; a communications terminal to output control signals; an electrical input terminal for receiving input of external electrical power; and an operation panel for commanding the polishing facility.

Standardization of the control panel is made possible because of the features presented above, and each block can be pre-tested and corrected if necessary, independently of all other blocks. These features contributes to lowering in operating cost, shortening of delivery schedules, improvement in reliability and productivity.

Furthermore, if facility upgrading is required in the future, there is no need to produce a new control panel, therefore, the cost of modification is low, and the facility has superior adaptability. If the layout is to be changed to meet customer needs, it is only necessary to re-wire the power cables and signal lines for the blocks concerned.

In another version of the polishing facility, for each function block, the driver, the electrical terminal, the control valves, the air supply provisions, the conversion interface and the communications terminal are housed in an individual chassis means, and devices in the chassis means are made accessible by pulling out the chassis means.

These features assure that control devices can be inspected easily and maintenance can be carried out readily.

In an aspect of the chassis means, it is protected from possible water and chemical damage by providing a drip tray.

As before, the layout can be changed easily to meet customer needs, and relocation/exchange can be made by changing the cables and signal wires only.

In an another version of the facility, each of the load/unload function block, transport function block, polishing function block, and cleaning function block is operatively connected to the control function block through a dedicated power source and dedicated signal lines; and a dedicated control program is provided for each of the load/unload function block, transport function block, polishing function block, and cleaning function block.

Because each of the blocks has its own power supply and signal lines, each block can be operated independent of the other blocks. The operation of each block is controlled by its own program. In other words, dedicated control functions are provided for both hardware and software aspects of each block. This feature provides complete adaptability to future upgrading or improvements to meet customer needs, and if control methodology is to be changed, the minimal changes in hardware and the software are necessary only for the block concerned. There is no need to make a new control panel, thus achieving one of the basic objects of adaptability to future needs of the polishing facility.

Another aspect of the facility presented above is that the control program includes a utility monitoring program. This feature allows monitoring of the operational conditions of the various devices in all the blocks to ensure that utility requirements for the operation of the facility, such as electrical power, purified water, compressed air are properly met all times.

Another aspect of the facility is that it has a polishing solution supply device, a waste management device, a cooling water supply device and a warm water supply device, and each of the devices is operatively connected to the control function block through dedicated signal lines. Each of the devices is controlled by their own signals from the control block, and the wiring needs are significantly reduced by this arrangement. This feature is also an important factor in reducing the production cost.

Another aspect of the facility is that an additional program is provided to control the polishing solution supply device, the waste management device, the cooling water supply device and the warm water supply device, therefore, it is possible to control the entire polishing operation through dedicated software for these ancillary functions which are not included in the basic configuration of functional blocks but are required to maximize the polishing efficiency.

BRIEF DESCRIPTION OF THE DRAWINGS

FIG. 1 is a schematic plan view of an embodiment of a polishing apparatus according to the present invention;

FIG. 3 is a cross-sectional view taken along line A1-A2 of FIG. 2A;

FIG. 4 is a cross-sectional view taken along line B1-B2 of FIG. 2A;

FIG. 6 is a cross-sectional view taken along line D1-D2 of FIG. 2A;

FIG. 7 is a schematic plan view of a second embodiment of a polishing apparatus according to the present invention;

FIG. 12 is a perspective external view of a further embodiment of a polishing facility of the present invention;

DETAILED DESCRIPTION OF THE PREFERRED EMBODIMENTS

Figure 2B:
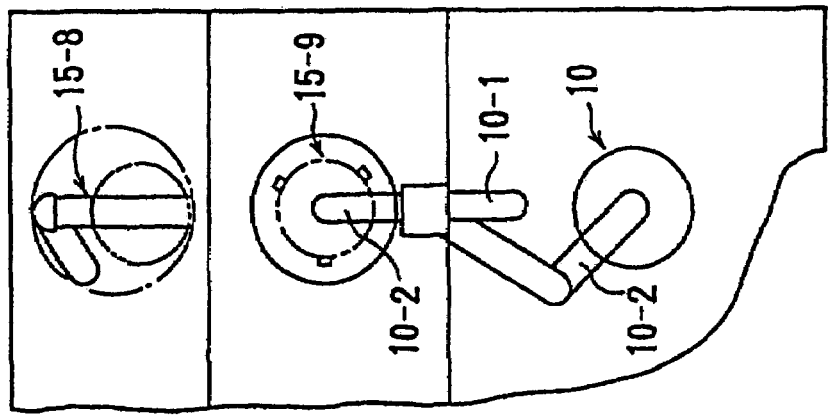
FIG. 2B is a schematic plan view of a washing unit in the polishing apparatus according to the present invention.

Each of the embodiments will be described with reference to polishing a workpiece in the form of a semiconductor wafer.

A first embodiment of a polishing apparatus according to the present invention will be described below with reference to FIG. 1. As shown in FIG. 1, the polishing apparatus has a center robot 10 having arms 10-1 and 10-2 at a central part thereof. The center robot 10 constitutes a universal transfer robot. Around the center robot 10 and in the area that can be accessed by the arm 10-1, there are provided a loading unit 11 on which a semiconductor wafer S to be polished, e.g. a dry semiconductor wafer, is placed, an unloading unit 12 on which a clean and dry semiconductor wafer S which has been polished and then cleaned and dried is placed, a polishing system including polishing units 13 and 14 each for polishing the semiconductor wafer S, and a washing system and drying system including washing unit 15 for washing and drying the polished, semiconductor wafer S.

The polishing unit 13 has a polishing head supporting arm 13-3, a turntable 13-4 and a top ring rotatably provided on the polishing head supporting arm 13-3. The polishing unit 14 has a polishing head supporting arm 14-3, a turntable 14-4 and a top ring rotatably provided on the polishing head supporting arm 14-3. An abrasive cloth is attached to each of respective upper surfaces of the turntables 13-4 and 14-4. Each of the polishing head supporting arms 13-3 and 14-3 constitutes an exclusive transferring device for transferring the semiconductor wafer S from a loading position 13-1, 14-1 of the polishing unit to the turntable 13-4, 14-4. Further, each of the polishing head supporting aims 13-3 and 14-3 constitutes an exclusive transferring device for transferring the polished semiconductor wafer S from the polishing unit 13, 14 to the washing unit 15. The polishing apparatus has a table 16 for a dressing tool 16-1 for dressing the abrasive cloth on the turntable 13-4 and a table 17 for a dressing tool 17-1 for dressing the abrasive cloth on the turntable 14-4.

In the polishing apparatus, the semiconductor wafer S to be polished is picked up under vacuum by the arm 10-1 of the center robot 10, is inverted to dispose a surface thereof to be polished downwardly, and is transferred to the loading position 13-1 of the polishing unit 13. The top ring of the polishing head supporting arm 13-3 holds the semiconductor wafer S and presses the semiconductor wafer S against the abrasive cloth attached to the upper surface of the turntable 13-4. At this time, the turntable 13-4 is rotated, and the top ring is rotated about its own axis and swung on the turntable 13-4 by the polishing head supporting arm 13-3, whereby the semiconductor wafer S is polished.

After such polishing operation, the polished semiconductor wafer S is transferred to a loading position 15-1 of the washing unit 15 by the polishing head supporting arm 13-3. The polishing head supporting arm 13-3 which releases the semiconductor wafer S at the loading position 15-1 chucks dressing tool 16-1 on the table 16 and presses the dressing tool 16-1 against the abrasive cloth on the turntable 13-4, thereby dressing such abrasive cloth. This dressing operation may be performed by an exclusive dressing mechanism.

The semiconductor wafer S which has been transferred to the loading position 14-1 of the polishing unit 14 by the arm 10-1 of the center robot 10 also is held by the top ring of the polishing head supporting arm 14-3 and pressed against the abrasive cloth attached to the upper surface of the turntable 14-4. After such polishing operation, the polished semiconductor wafer S is transferred to a loading position 15-2 of the washing unit 15. Further, the polishing head supporting arm 14-3 which releases the semiconductor wafer S chucks dressing tool 17-1 on the table 17 and presses the dressing tool 17-1 against the abrasive cloth on the turntable 14-4, thereby dressing such abrasive cloth.

The polished semiconductor wafer S transferred to the loading position 15-1 or the loading position 15-2 is washed and dried in the washing unit 15, and then is transferred to an unloading position 15-3. The polished semiconductor wafer S thus is cleaned and dried and is transferred from the unloading position 15-3 to the unloading unit 12 by the arm 10-1 of the center robot 10. All of the above described operations are performed entirely automatically.

Next, the polishing unit 14 and the washing unit 15 will be described in detail with reference to FIGS. 2A through 6A that further illustrate the embodiment of the present invention shown in FIG. 1. However, FIGS. 2A-6A do not illustrate a dressing tool and a table therefor, but rather illustrate an exclusive dressing mechanism 15-11.

Figure 2A:
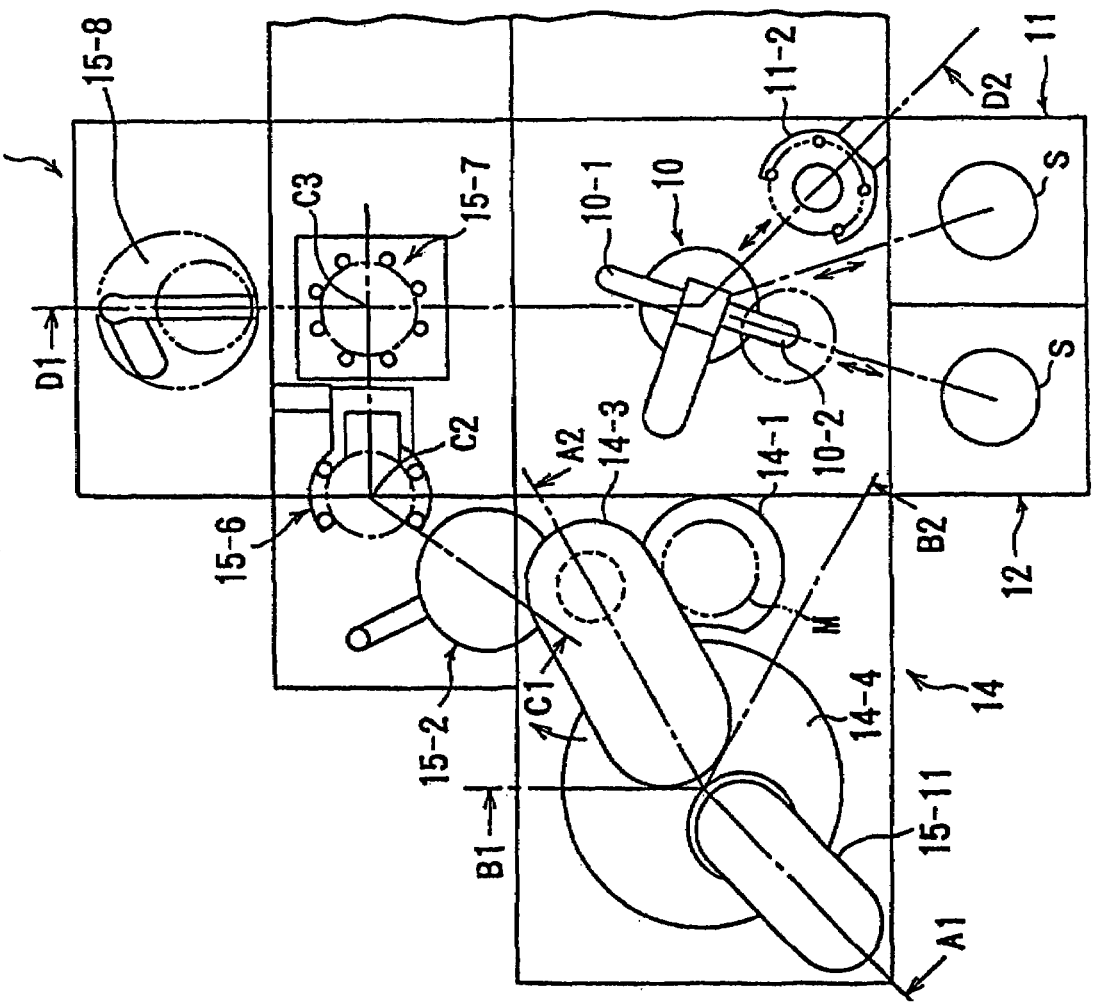
FIG. 2A is a schematic plan view of part of the polishing apparatus according to the present invention.
Figure 5:
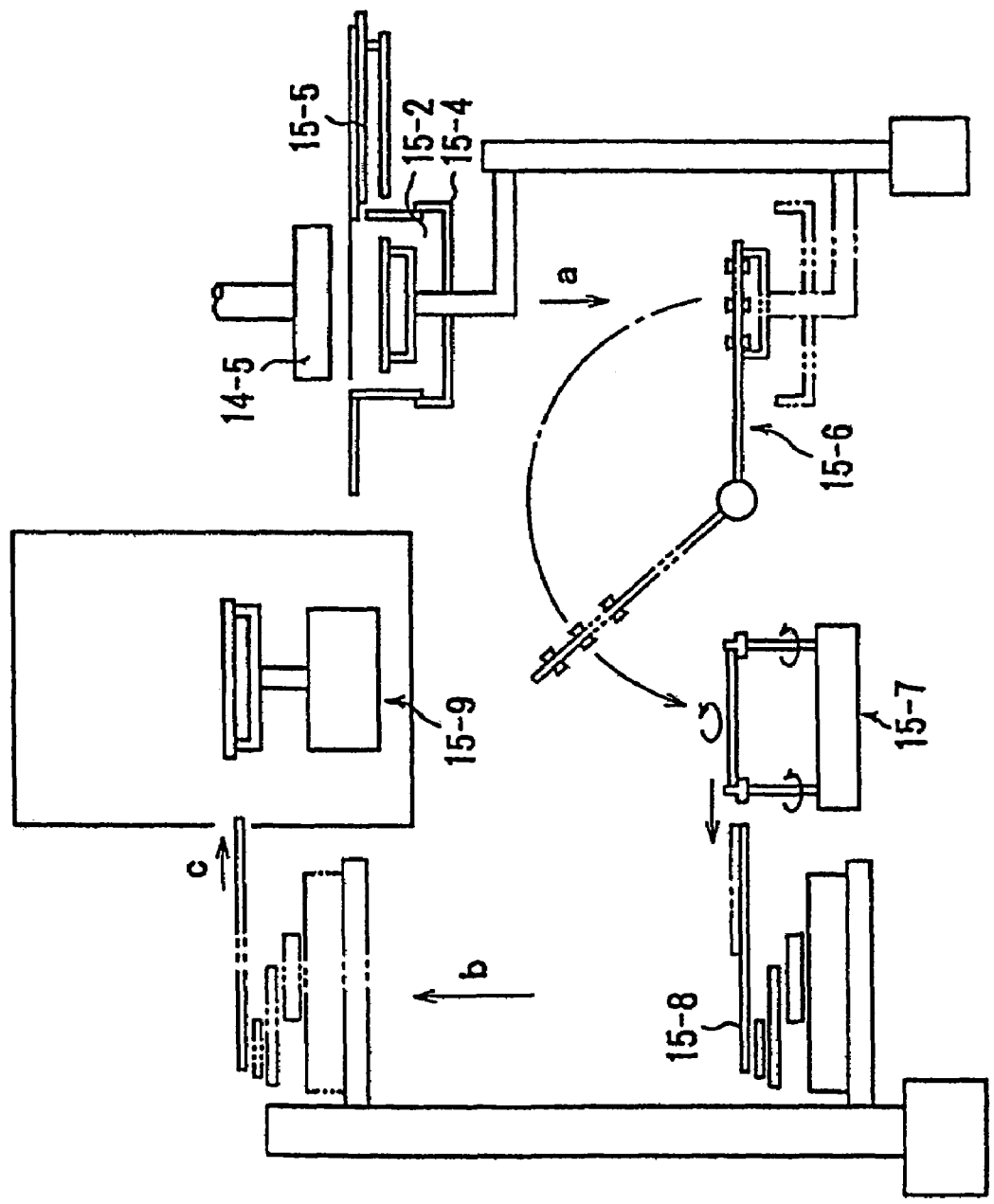
FIG. 5 is a cross-sectional view taken along line D1-C3-C2-C1 of FIG. 2A.

As shown in FIG. 2A, the semiconductor wafer S placed on the loading unit 11 is picked up by the arm 10-1 of the center robot 10, inverted to direct its surface to be polished downwardly by a reversing mechanism 11-2, and transferred to the loading position 14-1 of the polishing unit 14. As shown in FIG. 3, the semiconductor wafer S is held under vacuum by the top ring 14-5 provided at the forward end of the polishing head supporting arm 14-3 and moved above the turntable 14-4. Thereafter, the top ring 14-5 is lowered, and the semiconductor wafer S held by the top ring 14-5 is pressed against the abrasive cloth on the turntable 14-4, whereby the semiconductor wafer S is polished. The turntable 14-4 is rotated by a motor 14-6 through a timing belt 14-7 (see FIG. 4). As shown in FIG. 5, after such polishing operation, the arm 14-3 and top ring 14-5 put the semiconductor wafer S into a washing receptacle 15-4 which is standing by at an opening of the loading position 15-2 of the washing unit 15, and top ring 14-5 is washed by cleaning solvent. During such washing operation, the opening of the loading position 15-2 is closed by a shutter 15-5. The top ring 14-5 which releases the semiconductor wafer S is washed at the loading position by a washing mechanism of the washing unit 15.

After such washing operation, the semiconductor wafer S is moved in direction a (FIG. 5) and transferred to a reversing or inverting mechanism 15-6 by which the semiconductor wafer S is inverted to dispose its surface which has been polished upwardly and supplied to a primary washing station 15-7. A primary washing operation is carried out using cleaning solvent such as pure water at the primary washing station 15-7. Thereafter, the semiconductor wafer S is picked up by a transfer robot 15-8 in the washing unit 15, moved in directions of arrows b and c and fed to a secondary washing station 15-9. A secondary washing operation is carried out using cleaning solvent such as pure water at the secondary washing station 15-9.

After the secondary washing operation, the semiconductor wafer S is dried. Thus, the workpiece may be dried in the manner shown schematically in FIG. 6, wherein after the secondary washing operation at station 15-9, the wafer is dried by a drying system, in this embodiment spin-dried by spinning a wafer holding station at high speed, for example by a motor. This spinning is indicated schematically by the circular arrow in FIG. 6. The thus washed and dried polished wafer then is picked up by the arm 10-1 of the center robot 10, moved in directions of arrows d and e as shown in FIG. 6, and transferred to the unloading unit 12. As shown in FIG. 2A, dressing mechanism 15-11 dresses the abrasive cloth on the turntable 14-4. The dressing mechanism 15-11 has a rotating brush 15-12 as shown in FIG. 3.

Figure 6A:
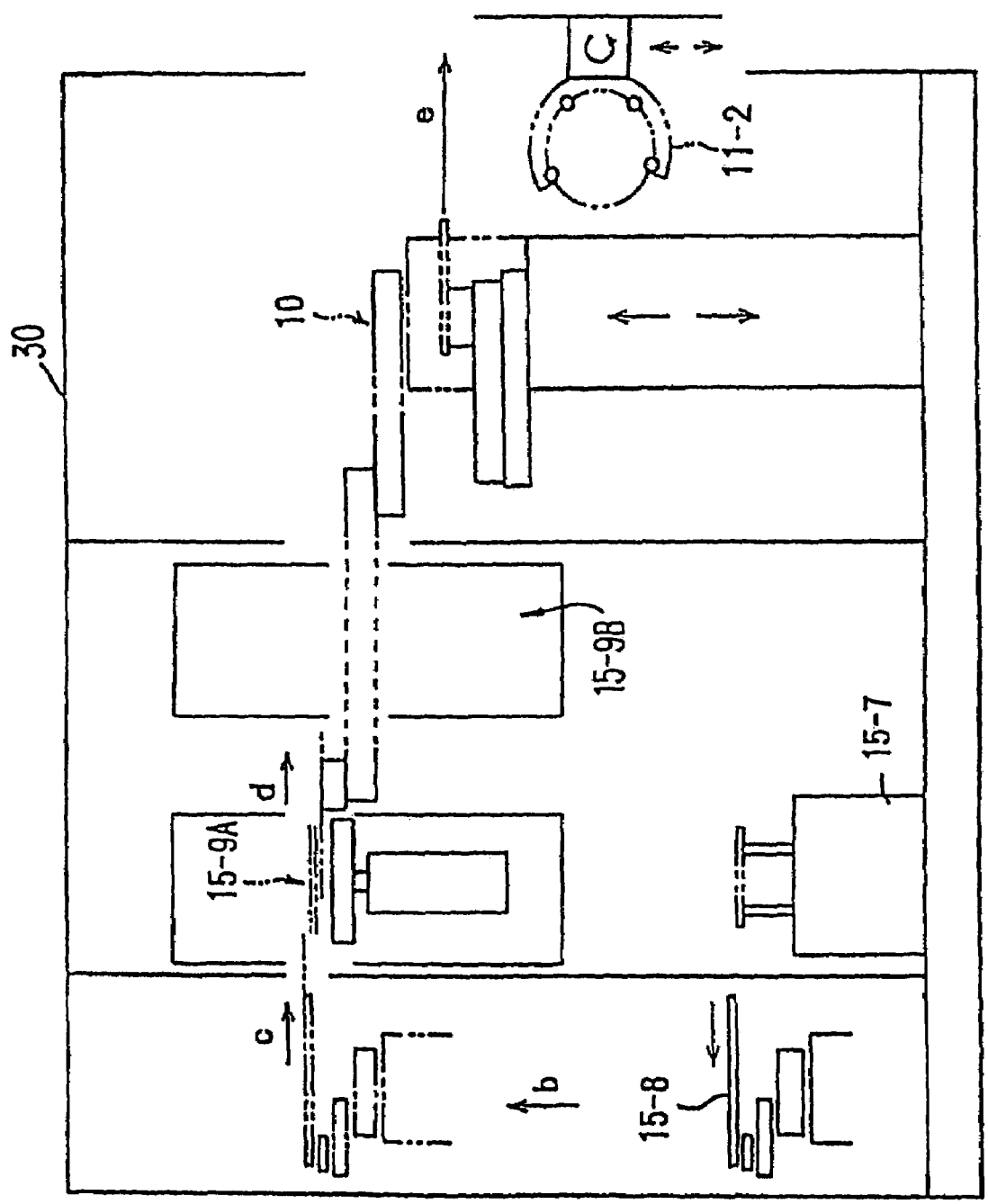
FIG. 6A is a view similar to FIG. 6, but showing a modified washing unit.

An alternative drying arrangement is shown schematically in FIG. 6A. Thus, the washing and drying system include a washing unit having a separate secondary washing station 15-9A and a separate drying station 15-9B. After secondary washing in station 15-9A, the thus cleaned wafer is transferred, for example by arm 10-1 of robot 10, to drying station 15-9B whereat the wafer is dried. The thus cleaned and dried polished wafer then is transferred by arm 10-1 of robot 10 and moved further in direction e to unloading unit 12.

The drying arrangements shown schematically in FIGS. 6 and 6A may be in accordance with the structures shown in Ser. No. 08/563,295, now U.S. Pat. No. 5,679,059 and Ser. No. 08/580,312, now U.S. Pat. No. 5,827,110, the disclosures of which hereby are incorporated herein by reference.

In accordance with the present invention, the entire apparatus is compact in size and therefore may be positioned in enclosing structure, e.g. a housing unit 30, shown schematically in FIGS. 6 and 6A. When housing unit 30 is provided with a necessary exhaust duct system, the polishing apparatus can be installed in a clean room without lowering the cleanliness thereof, without requiring a large amount of space in the clean room, and at any suitable and flexibly movable position within the clean room.

According to the first embodiment, the polishing apparatus comprises a center robot 10 having arms 10-1 and 10-2 and constituting a universal transfer robot for transferring the semiconductor wafer S to the respective units, a plurality of units disposed around the center robot 10 and including a loading unit 11 for receiving thereon the semiconductor wafer S to be polished, an unloading unit 12 for receiving thereon the clean and dry semiconductor wafer S which has been polished, polishing units 13 and 14 each for polishing the semiconductor wafer S, and a washing unit for washing and drying the polished semiconductor wafer S. The polishing apparatus further comprises a polishing head supporting arm 13-3 having a top ring for transferring the semiconductor wafer S between two adjacent units and a polishing head supporting arm 14-3 having a top ring for transferring the semiconductor wafer S between two adjacent units. A transfer structure includes center robot 10 that handles clean and dry semiconductor wafers S, and the polishing head supporting arms 13-3 and 14-3 that handle dirty and wet semiconductor wafers S. Particularly, center robot 10 handles a, e.g. dry, semiconductor wafer S from the loading unit 11 to the loading position of the particular polishing unit, and center robot 10 also handles a clean and dry polished semiconductor wafer S from the unloading position 15-3 of the washing unit 15 to the unloading unit 12. On the other hand, the polishing head supporting arms 13-3 and 14-3 handle dirty and wet semiconductor wafers S from the respective polishing units to the washing unit.

The center robot 10 has the arm 10-1 which is exclusively used for loading the semiconductor wafer to be polished and the arm 10-2 which is exclusively used for unloading the clean and dry semiconductor wafer which has been polished. This arrangement is preferable in a case where the degree of cleanliness of the semiconductor wafer S transferred from the loading unit 11 is different from that of the semiconductor wafer S transferred to the unloading unit 12.

Next, a further embodiment of the polishing apparatus according to the present invention will be described below with reference to FIG. 7. The parts shown in FIG. 7 which are identical to those of FIG. 1 are denoted by identical reference numerals. The polishing apparatus has a center robot 10 having arms 10-1 and 10-2 at a central part thereof. Around the center robot 10 and in an area that can be accessed by the arm 10-1, there are provided a loading unit 11, an unloading unit 12, polishing units 13 and 14, a washing unit 15, and auxiliary spaces 18 and 19 for accommodating additional units, in a hexagonal arrangement.

In the auxiliary spaces 18 and 19 are installed, for example, thickness meters for measuring a thickness of the semiconductor wafer. In such case, the, e.g. dry, semiconductor wafer S is held by the arm 10-1 of the center robot 10 and fed to the thickness meter in the auxiliary space 18. Before a polishing operation, the thickness of the semiconductor wafer S is measured by the thickness meter, and then the wafer S is transferred to the loading position 13-1 of the polishing unit 13.

After a polishing operation, the polished semiconductor wafer S is transferred to the washing unit 15 in the same manner as in the first embodiment and is washed and dried in the washing unit 15. After such washing operation, the clean and dry polished semiconductor wafer S is fed to the thickness meter in the auxiliary space 18 by the arm 10-1 of the center robot. After measuring the thickness of the semiconductor wafer S which has been polished, the clean and dry polished semiconductor wafer S is transferred to the unloading unit 12 by the arm 10-2 of the center robot 10.

Figure 8:
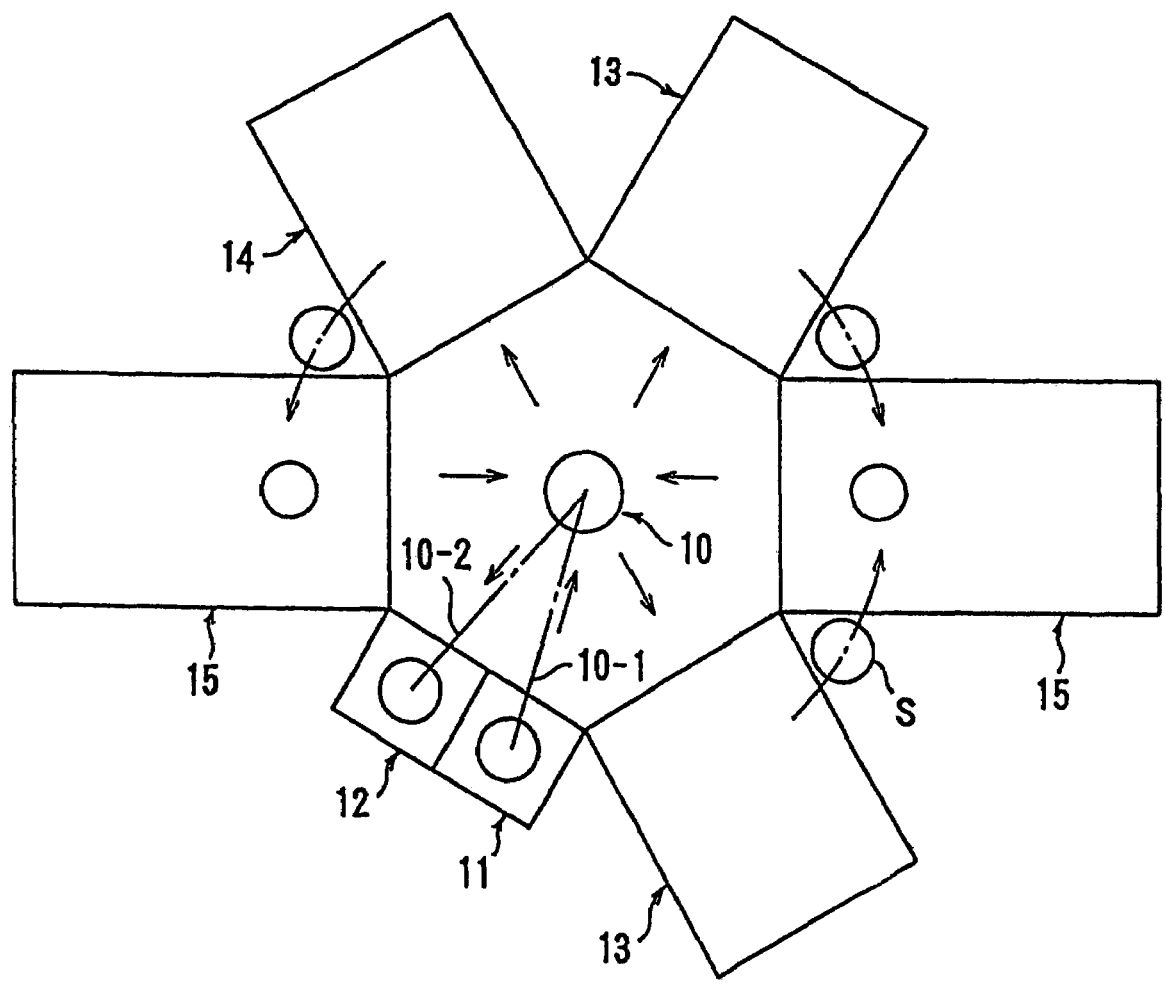
FIG. 8 is a schematic plan view of a third embodiment of a polishing apparatus according to the present invention.

FIG. 8 shows another embodiment of the polishing apparatus according to the present invention. The parts shown in FIG. 8 which are identical to those of FIG. 1 are denoted by identical reference numerals. Around a center robot 10 having arms 10-1 and 10-2 and in the area that can be accessed thereby, there are provided, in a hexagonal arrangement, a loading unit 11, an unloading unit 12, a polishing system including two polishing units 13 and a polishing unit 14, a washing unit 15 provided between the polishing unit 14 and the unloading unit 12. This arrangement is preferable in the case where the polishing unit 13 requires twice as much time as the polishing unit 14 to polish a wafer.

In this case, the transfer of the semiconductor wafer S from the polishing units 13 to the washing unit 15 and the transfer of the semiconductor wafer S from the polishing unit 14 to the washing unit 15 are performed, not by the center robot 10, but by another transfer means such as the polishing head supporting arms 13-3 and 14-3. However, the loading of the dry semiconductor wafer to the polishing units 13 and 14 and the removal of the clean and dry polished semiconductor wafer from the washing units 15 are performed by the arms 10-1 and 10-2, respectively, of the center robot 10. That is, the center robot 10 does not handle the semiconductor wafer polished by the polishing units 13 and 14 so that the arms 10-1 and 10-2 of the center robot 10 are not contaminated by the semiconductor wafer which has been polished and to which abrasive slurry adheres.

Figure 9:
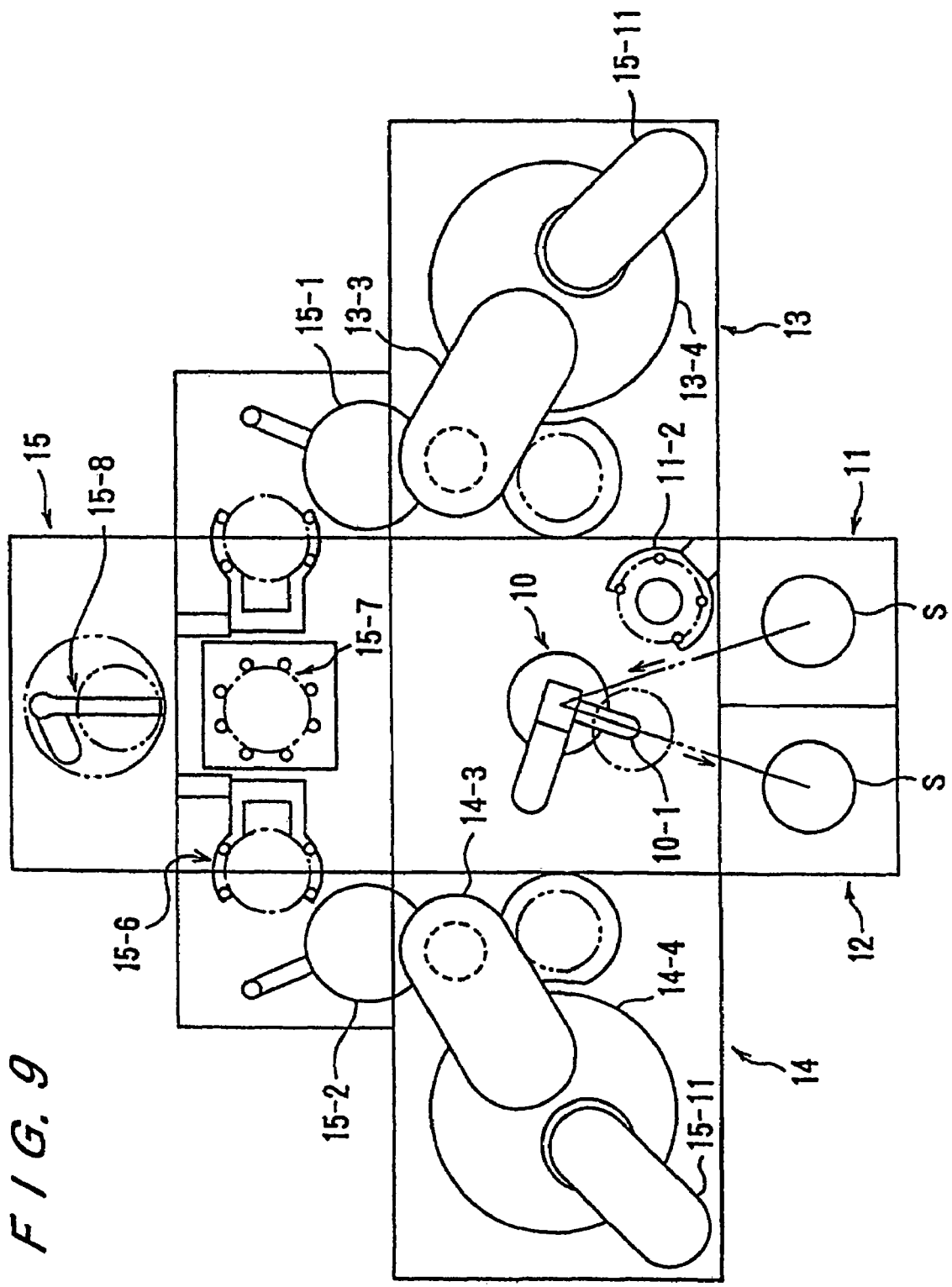
FIG. 9 is a schematic plan view of a fourth embodiment of a polishing apparatus according to the present invention.

FIG. 9 shows a still further embodiment of the polishing apparatus according to the present invention. The parts shown in FIG. 9 which are identical to those of FIG. 1 are denoted by identical reference numerals. The polishing apparatus is provided with a transfer structure including center robot 10 having only one arm 10-1. In the case of providing only the arm 10-1, the transfer structure also includes exclusive transferring devices provided between the polishing units 13 and 14, and between the polishing units 13, 14 and the washing unit 15. This system is applicable to a case where the degree of cleanliness of the dry semiconductor wafer which is transferred from the loading unit 11 is substantially the same as that of the clean and dry polished semiconductor wafer which is transferred to the unloading unit 12.

Figure 10:
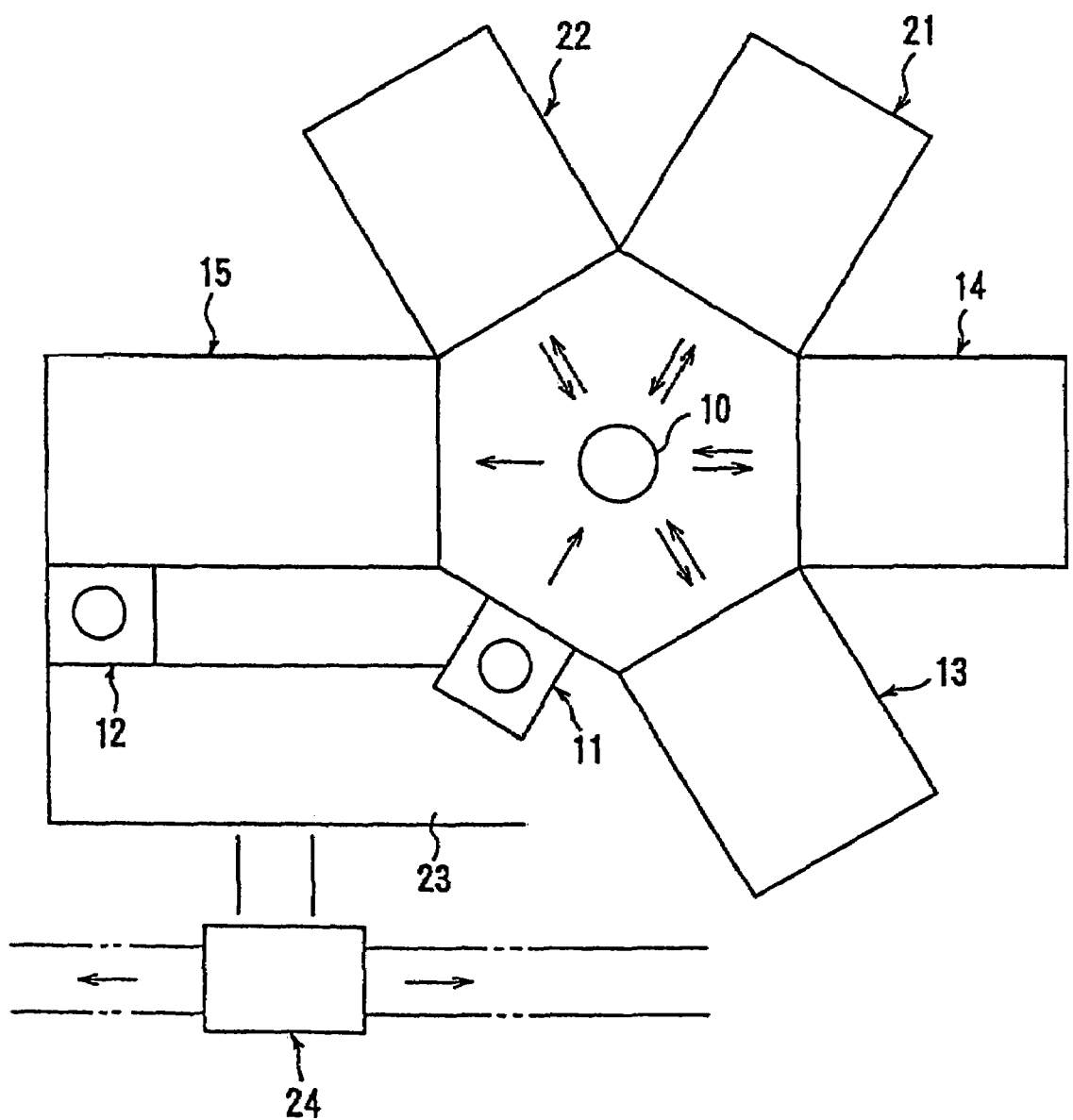
FIG. 10 is a schematic plan view of a fifth embodiment of a polishing apparatus according to the present invention.

FIG. 10 shows a still further embodiment of the polishing apparatus according to the present invention. The parts shown in FIG. 10 which are identical to those of FIG. 1 are denoted by identical reference numerals. Around a center robot 10 having arms and in the area that can be accessed by the arms, there are provided in a hexagonal arrangement a loading unit 11, a polishing system including four polishing units 13, 14, 21 and 22, and a washing unit 15. An unloading unit 12 is disposed at the end of the washing unit 15. Further, a storage unit 23 is disposed adjacent to the loading unit 11 and the unloading unit 12. An automatic guided vehicle 24 is employed to transfer a semiconductor wafer S which has been polished from the storage unit 23 and to convey a semiconductor wafer to be polished to the storage unit 23.

Loading of the semiconductor wafer S onto the polishing units 13, 14, 21 and 22 and the washing unit 15 and removal of the semiconductor wafer S from the loading unit 11 and the polishing units 13, 14, 21 and 22 are carried out entirely by the center robot 10. Further, the transfer of the semiconductor wafer from the washing unit 15 to the unloading unit 12 is carried out by the center robot 10. The center robot 10 of this embodiment forms the transfer structure including an arm for exclusively handling a clean semiconductor wafer (hereinafter referred as clean wafer handling arm) and an arm for exclusively handling a dirty semiconductor wafer (hereinafter referred as dirty wafer handling arm). The transfer of the, e.g. dry, semiconductor wafer from the loading unit 11 to one of the polishing units 13, 14, 21 and 22 and the transfer of the clean and dry polished semiconductor wafer from the washing unit 15 to the unloading unit 12 are carried out by the clean wafer handling arm, and the transfer of the semiconductor wafer between the polishing units 13, 14, 21 and 22 and the transfer of the polished semiconductor wafer from one of the polishing units 13, 14, 21 and 22 to the washing unit 15 are carried out by the dirty wafer handling arm. For example, in the case of using the center robot 10 of FIG. 1, the arm 10-1 serves as the clean wafer handling arm and the arm 10-2 serves as the dirty wafer handling arm. This structure prevents as much as possible the semiconductor wafer from being contaminated.

According to this embodiment, the polishing apparatus comprises a center robot 10 having arms 10-1 and 10-2 and constituting a universal transfer robot for transferring a semiconductor wafer S to the respective units, a plurality of units disposed around the center robot 10 and including a loading unit 11 for receiving thereon the semiconductor wafer S to be polished, e.g. a dry wafer, an unloading unit 12 for receiving thereon the clean and dry semiconductor wafer S which has been polished, a polishing system including polishing units 13, 14, 21 and 22 each for polishing the semiconductor wafer S and a washing unit 15 for washing and drying the semiconductor wafer S. The center robot 10 is provided with an arm exclusively for handling a clean semiconductor wafer and an arm exclusively for handling a dirty semiconductor wafer. The arm for exclusively handling a dirty semiconductor wafer is washed by a washing mechanism provided in the washing unit 15 after handling the dirty semiconductor wafer.

Figure 11:
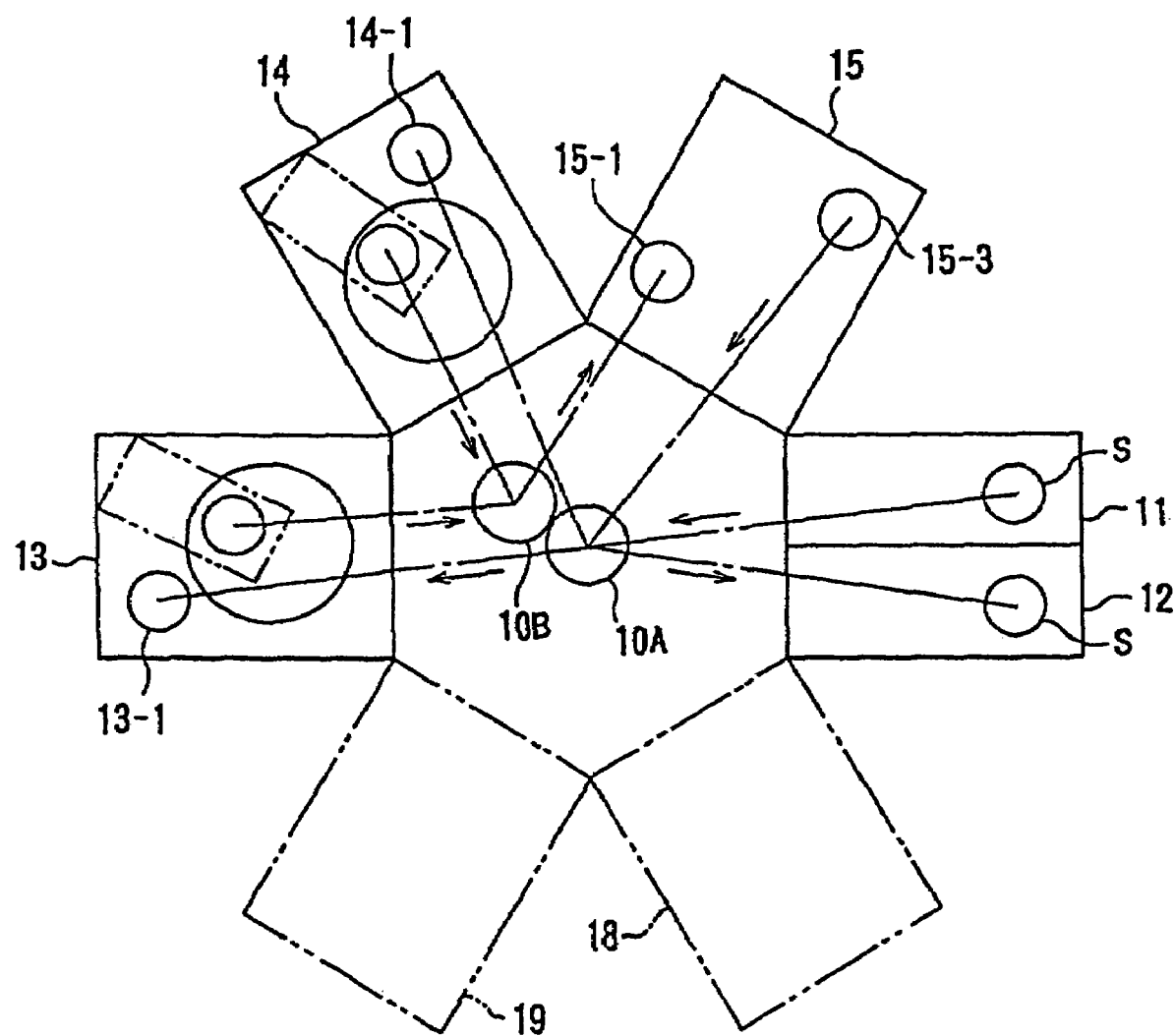
FIG. 11 is a schematic plan view of a sixth embodiment of a polishing apparatus according to the present invention.

FIG. 11 shows still another embodiment of the polishing apparatus according to the present invention. The parts shown in FIG. 11 which are identical to those of FIG. 1 are denoted by identical reference numerals. In this embodiment, the polishing apparatus comprises a transfer structure including a center robot 10A for exclusively handling a clean semiconductor wafer and a center robot 10B for exclusively handling a dirty semiconductor wafer. Further, the polishing apparatus comprises a polishing system including two polishing units 13, 14 and a washing unit 15.

With the above structure, a, e.g. dry, semiconductor wafer S is picked up from a loading unit 11 by the center robot 10A and transferred thereby to a loading position 13-1 of the polishing unit 13. After a polishing operation, the polished semiconductor wafer S is picked up from the polishing unit 13 by the center robot 10B and transferred thereby to a loading position 15-1 of the washing unit 15. After washing and drying operations by washing and drying systems, the resultant clean and dry polished semiconductor wafer S is picked up from a loading position 15-3 of the washing unit 15 by the center robot 10A and transferred thereby to an unloading unit 12. By the above manner, a polishing process and washing and drying processes are carried out. A polishing operation is conducted by the polishing unit 14 in the same manner as described above.

According to this embodiment, the semiconductor wafers S are polished simultaneously or at a certain time lag by the polishing units 13 and 14, and each of the semiconductor wafers S polished by the polishing units 13 and 14 is washed and dried by washing and drying systems in the washing unit 15. That is, it is possible to deal with two semiconductor wafers with one washing unit for every two polishing units. Especially in the case where the cycle of the washing unit, i.e. the time interval between washing of a preceding semiconductor wafer and washing of a subsequent semiconductor wafer, is sufficiently shorter than the time required to polish semiconductor wafers, there is no downtime during the polishing operations. Thus, the processing speed of the overall apparatus is prevented from being lowered and the total system can be more compact in size.

Further, the polishing units 13 and 14 can be set to polish semiconductor wafers under different conditions and selected in accordance with properties of the semiconductor wafers. Furthermore, a semiconductor wafer can be polished by the polishing unit 13, washed by the washing unit 15, and then polished by the polishing unit 14. Thereafter, the semiconductor wafer S can be washed and dried by the washing unit 15. That is, the semiconductor wafer can be polished twice. Such polishing apparatus has auxiliary spaces 18 and 19 as shown in FIG. 11.

According to this embodiment, the polishing apparatus comprises two center robots 10A, 10B each constituting a universal transfer robot for transferring a semiconductor wafer S to respective units, a plurality of units disposed around the center robots 10A and 10B and including a loading unit 11 for receiving thereon a semiconductor wafer S to be polished, e.g. a dry wafer, an unloading unit 12 for receiving thereon a clean and dry semiconductor wafer S which has been polished, polishing units 13 and 14 each for polishing a semiconductor wafer S and a washing unit 15 for washing and drying a semiconductor wafer S which has been polished. The center robot 10A handles only a clean semiconductor wafer, and the center robot 10B handles only a dirty semiconductor wafer. The center robot 10B is washed by a washing mechanism provided in the washing unit 15 after handling the dirty semiconductor wafer.

According to the above embodiments, since at least one polishing unit for performing chemical/mechanical polishing and at least one washing and drying unit are disposed around a center robot, the entire system is compact in size. Therefore, by providing an enclosing structure such as a housing unit (e.g. as shown at 30 in FIG. 6, 6A) to cover the entire system and an exhaust duct, the polishing apparatus can be installed in a clean room without lowering the cleanliness thereof. Further, the amount of space in the clean room required for installation of the polishing apparatus can be reduced.

In the above embodiments, although the loading unit 11 and the unloading unit 12 are provided separately, the loading unit 11 and the unloading unit 12 may be formed integrally. For example, in the case where a semiconductor wafer is picked up from a basket containing semiconductor wafers and is put into the same basket after undergoing a polishing operation and washing and drying operations, the loading unit and the unloading unit are formed integrally.

The basket comprises a cassette which is placed on the loading unit and/or the unloading unit. A semiconductor wafer may be picked up from a cassette on the loading unit and the unloading unit and may be put into the same cassette on the loading unit and the unloading unit after undergoing a polishing operation and washing and drying operations. Further, a semiconductor wafer may be picked up from a cassette on the loading unit and may be put into a cassette on the unloading unit after undergoing a polishing operation and washing and drying operations.

The cassette which is placed on the loading unit and/or the unloading unit may be in accordance with the structures shown in Ser. No. 08/563,295, now U.S. Pat. No. 5,679,059 and Ser. No. 08/580,312, now U.S. Pat. No. 5,827,110, the disclosures of which hereby are incorporated herein by reference.

According to the present invention, a cluster type of polishing apparatus which integrates a plurality of units including a polishing unit defining a polishing system and a washing and drying unit defining washing and drying systems and which employs a universal transfer robot can be constructed. The polishing apparatus performs a series of processes including a polishing operation and washing and drying operations while saving installation space and improving processing speed by efficiently combining a plurality of units including at least one polishing unit and at least one washing and drying unit. In the case where the time required for polishing is longer than the cycle time of the washing and drying operations, the polishing system can include a plurality of polishing units to polish a plurality of semiconductor wafers and be associated washing and drying systems formed in one washing and drying unit. On the contrary, in the case where the cycle time of the washing and drying operations is longer than the time required for polishing, the washing and drying systems can be formed by a plurality of washing and drying units to wash and dry a plurality of semiconductor wafers and be associated with a polishing system in the form of one polishing unit. Further, according to the present invention, one or more polishing operations and one or more of each of washing and drying operations can be fully automated and can be changed or modified easily.

Furthermore, according to the present invention, since the transfer structure includes exclusive means for handling a clean semiconductor wafer and exclusive means for handling a dirty semiconductor wafer that are provided separately, contamination of subsequent semiconductor wafers or of respective units of the polishing apparatus caused by the dirty semiconductor wafer can be prevented.

FIG. 12 shows an external view of a facility housing A with a delivery opening 3 to accept a cassette 2. When the cassette 2 containing the wafers 1 to be polished is delivered to the delivery opening 3, and the power to an operation panel 4 is turned on, one wafer 1 at a time is withdrawn to be polished automatically from inside the cassette 2, and the wafer 1 is polished, cleaned and returned to its original cassette 2. When all the wafers 1 inside the cassette 2 have been processed, the cassette is delivered to a next processing station.

Figure 13A:
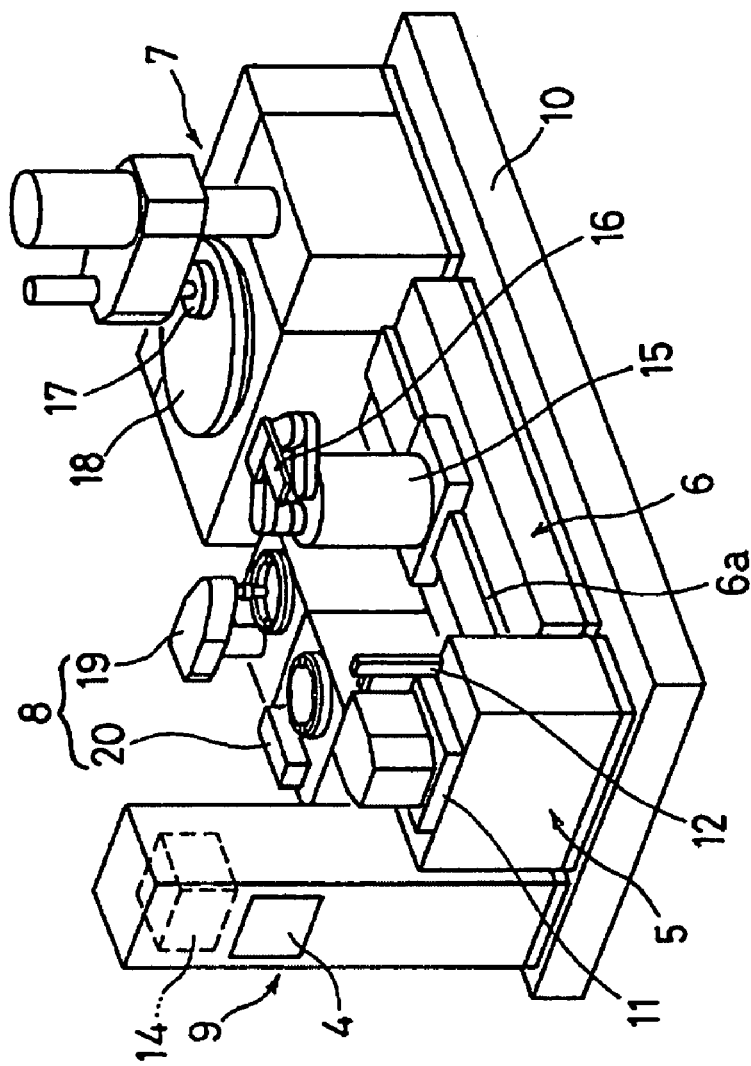
FIG. 13A is a perspective internal view of a polishing facility shown in FIG. 12.
Figure 13B:
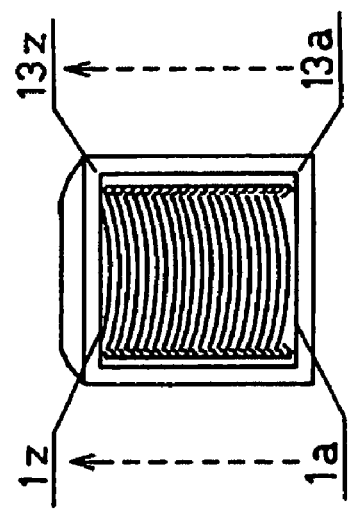
FIG. 13B is a perspective external view of a cassette.

FIG. 13 shows an inside view of the facility housing A comprises the polishing facility: a load/unload block 5 for delivery of cassette 2 containing the wafers 1; a transport block 6 for moving the wafers 1, polishing block 7 for polishing the wafers 1; cleaning block 8 for cleaning the polished wafers 1; and a control block 9 for controlling the operations of each of the functional blocks. All of these blocks are independently erected on a common base 10.

The load/unload block 5 comprises: a cassette stage 11 for placing a cassette 2; a mapping sensor 12 for determining (mapping) the number of wafers 1a-1z and the corresponding wafer shelves 13a-13z. The data from the load/unload block 5 is stored in a computer 14 in the control block 9.

The transport block 6 comprises a robot 15 disposed on a rail 6a permitting translation therealong; and fingers 16 for transferring a wafer 1a from one block to another block. Several robot units 15 can be provided on the rail 6a and operated as a robotic unit 15.

The polishing block 7 has a turntable 18 and an opposing top ring 17. The turntable 18 has a polishing cloth mounted on its top surface to which a polishing solution is supplied during a polishing step.

The cleaning block 8 comprises a cleaning tank 19 for cleaning of the wafers 1 with purified water, and a drying tank 20. These are the only component devices comprising the cleaning block 8.

These five blocks operate independent of each other so that if any of the blocks is subjected to be exchanged, added or reconfigured, such an action will not interfere with the operation of other functional blocks. Therefore, none of these blocks is arranged in a specific order, and various combinations of positioning and work flow directions are possible for a user.

Each one of these blocks, i.e. load/unload block 5, transport block 6, polishing block 7 and cleaning block 8, is provided with the following operating devices, i.e. a driver for driving the motor, an electrical terminal for supplying electrical power to the driver, a control valve for controlling the operations of air cylinder and process valves, air supply provisions for supplying air to the control valves, a conversion interface for control of signals for the driver and the control valves, as well as a communications terminal for receiving control signals.

Figure 14:
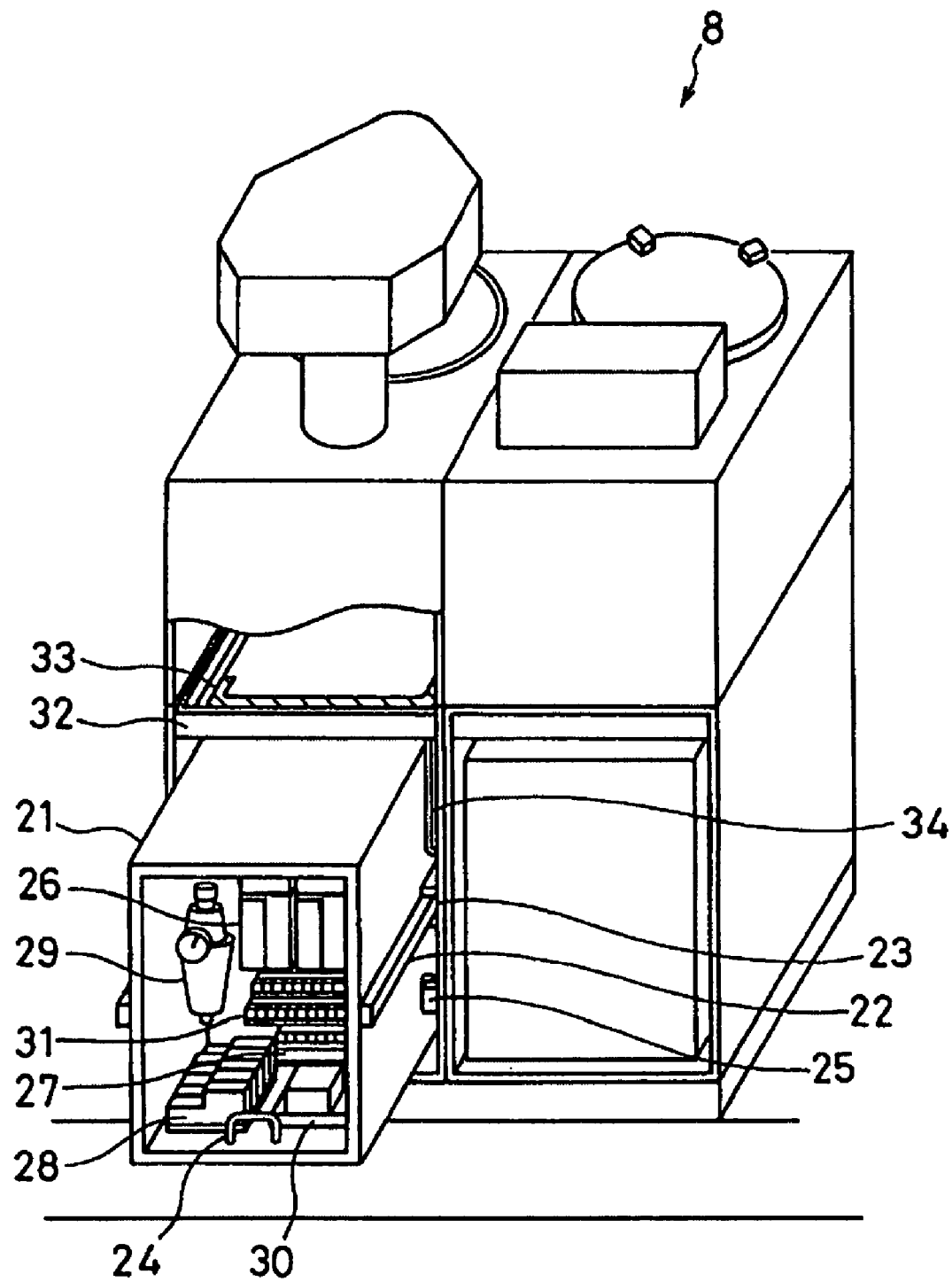
FIG. 14 is a further embodiment of a polishing facility according to the present invention.

The structure of such a unitized functional block will be explained with reference the cleaning block 8 shown in FIG. 14, as an example. The drawing shows a chassis 21, housing control devices for the cleaning block 8, being pulled out of the cleaning block 8. Each of the side surfaces of the chassis 21 is provided with a side bar 22 which engages with a rail 23, and the chassis 21 can be pulled out by a handle 24 by sliding on the rails 23. A stopper 25 is provided on the chassis 21 to prevent it from falling out. The cables and the piping in the chassis 21 are flexible and test operation can be performed while being operatively connected to the cleaning block 8.

Within the chassis 21, there is a driver 26 for generating electrical power to drive the motor for the cleaning brushes, an electrical terminal 27 for supplying power to the driver 26, an air cylinder for positioning the cleaning brush above the wafer, a control valve 28 for controlling a valve for delivering cleaning water, an air supply provision 29 for supplying air to the control valve 28, a conversion interface 30 and a communication terminal 31 for receiving control signals.

Above the drawer of the chassis 21, there is a drip tray 32 for preventing any drips, if the cleaning section should spring a leak, from entering into the electrical devices in the chassis 21. There is a water leak sensor 33 on the inside surface of the drip tray 32 to generate a warning signal when a leak should occur and the collected water is discharged through a drain pipe 34 connected to the system drain.

The provision of devices in the chassis 21, including a driver for driving the motor, an electrical terminal for supplying electrical power to the driver, a control valve for controlling the operations of air cylinder and process valves, air supply provisions for supplying air to the control valves, a conversion interface for controlling signals for the driver and the control valves, as well as a communications terminal for receiving control signals, is the same for other blocks in the facility, i.e. load/unload block 5, transport block 6 and polishing block 7.

Figure 15:
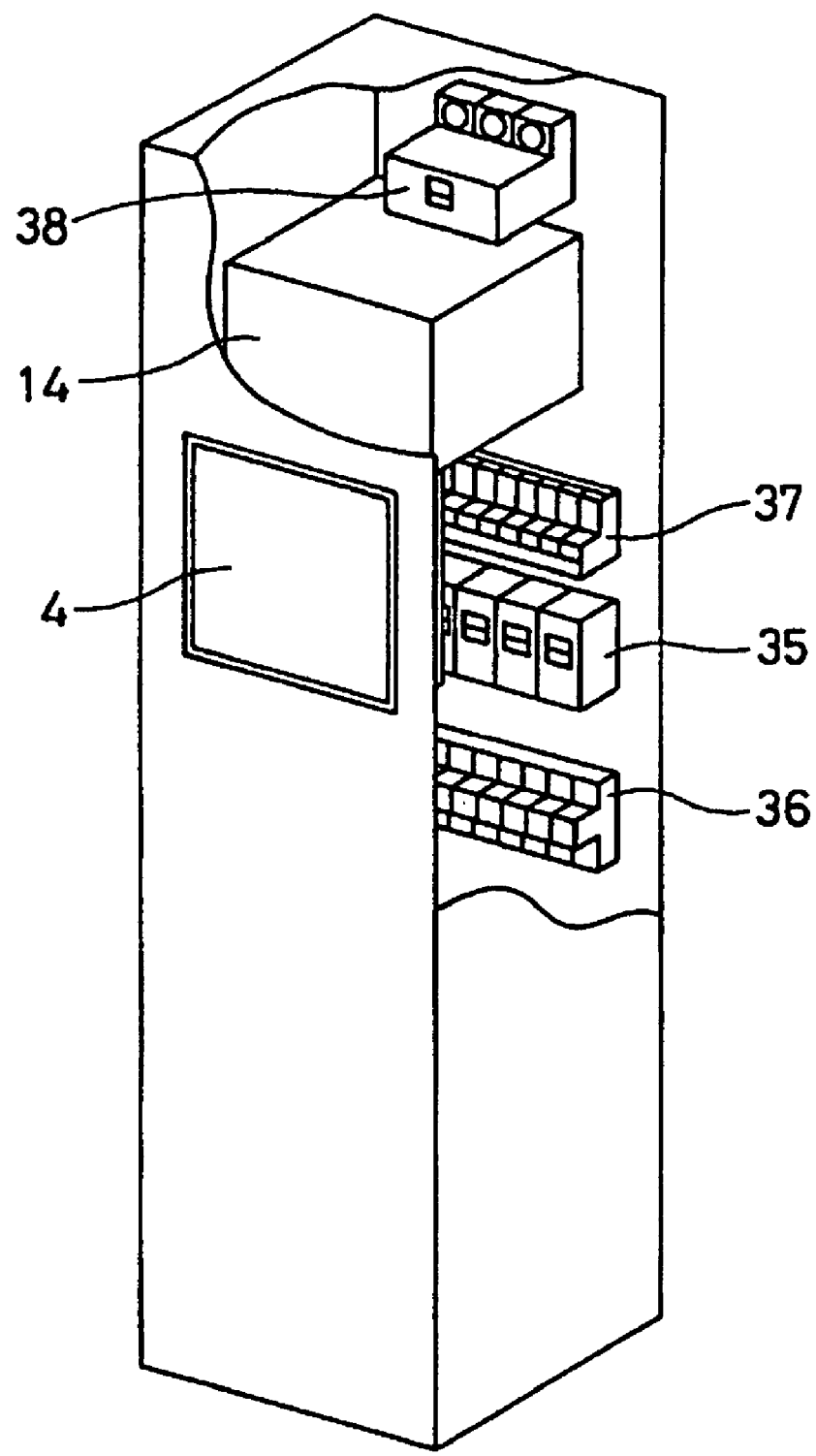
FIG. 15 is a perspective partial cutaway view of a control block.

FIG. 15 shows the control block 9 comprising: a power source 35 for supplying electrical power to each of the blocks 5, 6, 7 and 8 through an electrical terminal 36; a computer 14 for generating command signals; a communications terminal 37 to output control signals; an electrical input terminal 38 for receiving input of external electrical power; and an operation panel 4 for command of the facility.

The control device and the cleaning block 8 are connected with an electrical power line L for transmission of power from the electrical terminal 27 of the cleaning block 8 and the electrical terminal 36 of the control block 9, and control signals are transmitted via communication line C between the communication terminal 31 of the cleaning block 8 and the communication terminal 37 of the control block 9.

Figure 16:
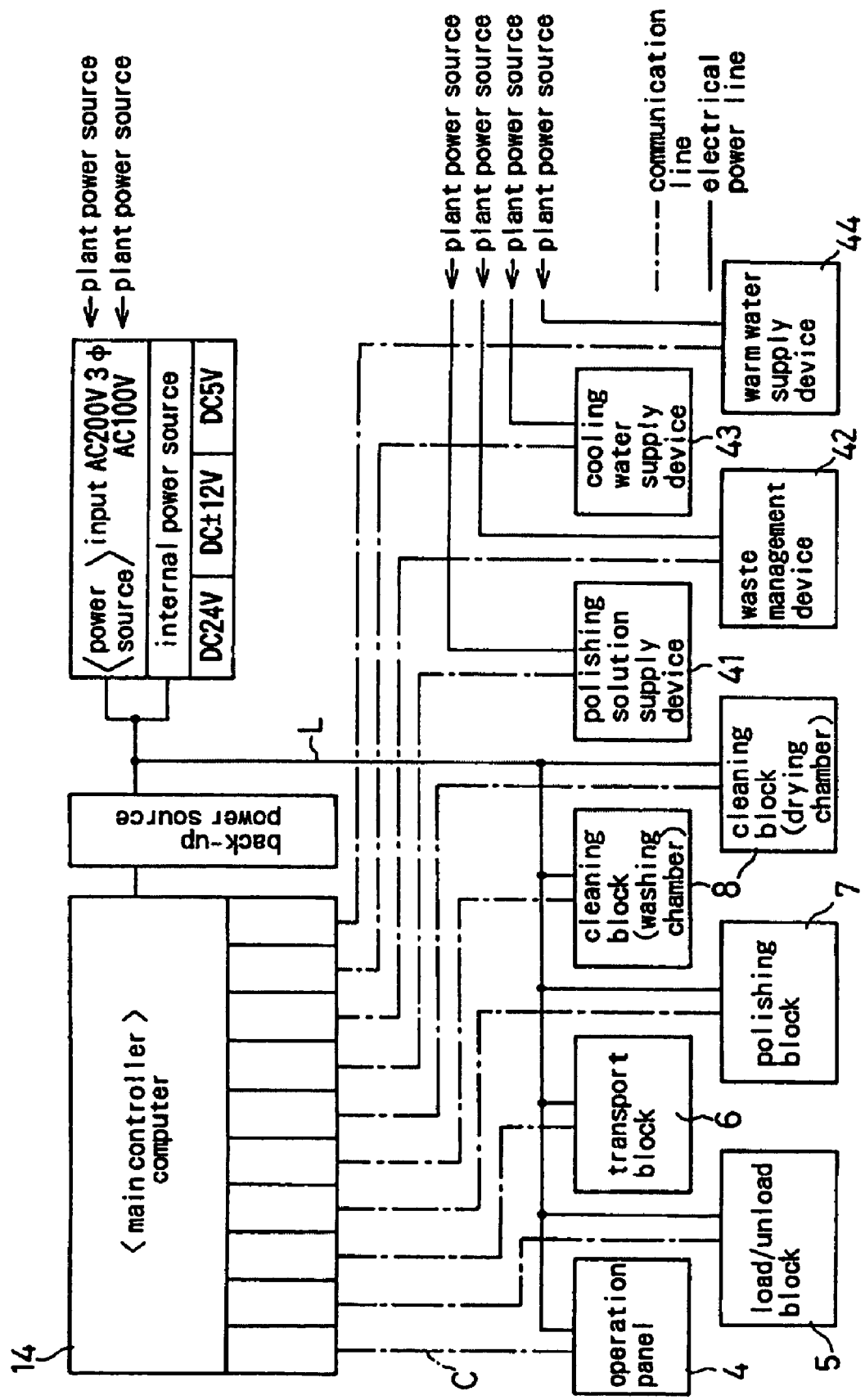
FIG. 16 is a block diagram of the control hardware of the embodiment of FIG. 12.

FIG. 16 shows a block diagram of the control hardware system. Each of the blocks 5-9 is electrically connected to a power source within the control panel, and the control device is communicated with the computer 14 which is the main controller for the control panel. Ancillary devices, i.e. the polishing solution supply-device 41, waste management device 42, cooling water supply device 43 and the warm water supply device 44 are provided with their own separate control device, but the operational control of these ancillary devices is provided by the computer 14 in the polishing facility.

Figure 17:
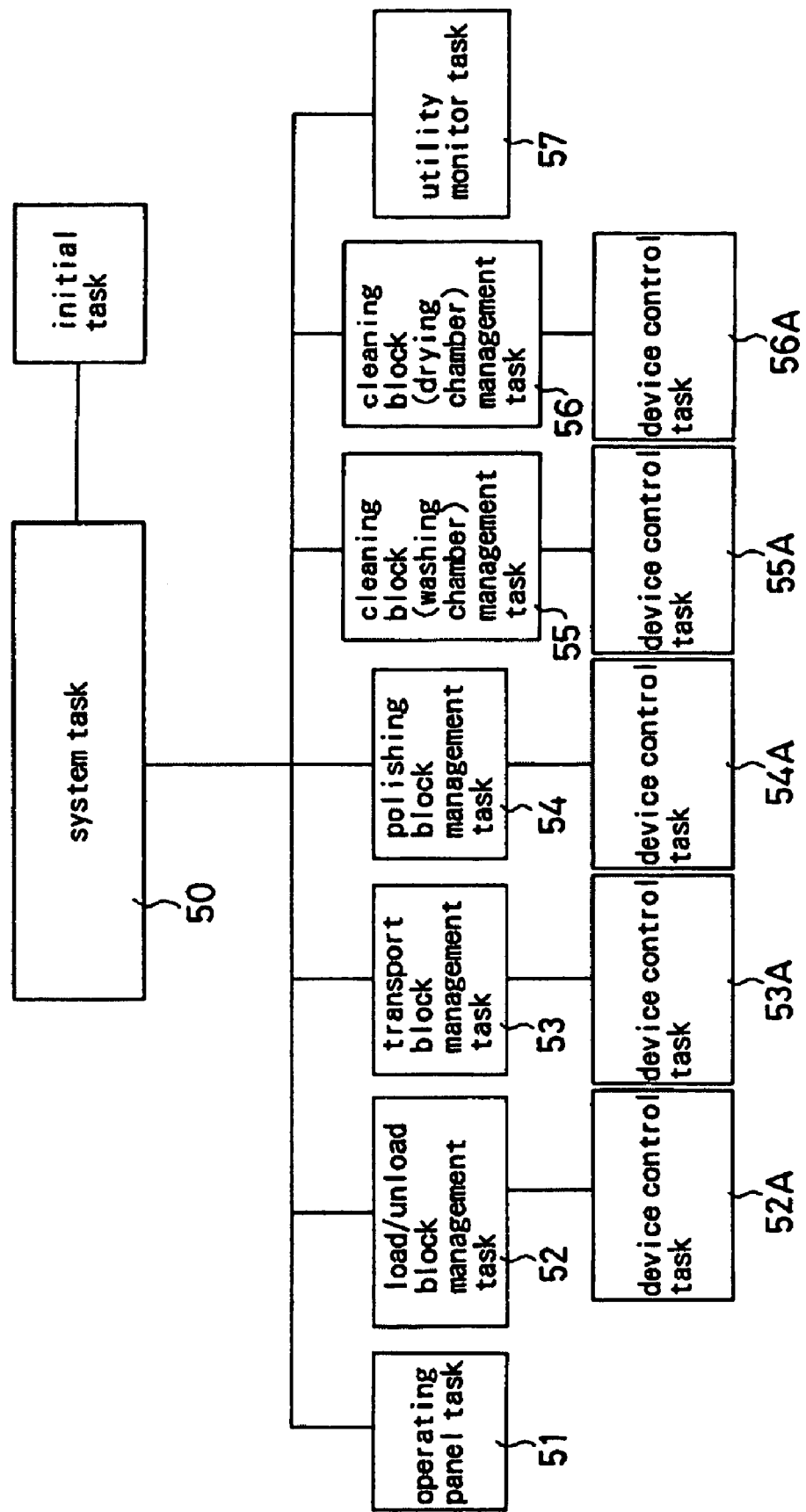
FIG. 17 is a schematic diagram of control hardware for the entire polishing facility including monitoring of ancillary devices.

FIG. 17 shows the organization of the tasks for the control system. The overall system task 50 comprises the following programs: an operating panel task 51; management tasks 52-56 for each block; and utility monitor task 57. Each of the management tasks 51-56 supports device control tasks 52A-56A for each block.

The operation of the polishing facility is explained in the following.

The cassette 2 which is delivered to the delivery opening 3 shown in FIG. 12 is placed on the stage 11 of load/unload block 5. The mapping sensor 12 determines the number of wafers 1a-1z stored in the wafer shelves 13a-13z, and these wafer data are stored in the computer 14 in the control block 9. When wafer mapping is completed, the finger 16 of the robot 15 disposed on the transport block 6 takes out a wafer 1a from a wafer shelf 13a in the cassette 2.

The relative position of the robot 15 with respect to the cassette 2 is stored in the computer 14 by the teaching of the robot 15 after positioning of each of the blocks has been decided. In other words, actions and positions of the robot 15 are generated by commands from the computer 14, and not restricted by geometrical constrictions imposed by the structures of the load/unload block 5 and the transport block 6 which carries the robot 15.

The wafer 1a taken out of the cassette 2 is attached to the top ring 17 of the polishing block 7, and is polished on the turntable 18. The top surface of the turntable 18 is provided with a polishing cloth, and the wafer 1a is polished while the polishing solution is being supplied to the polishing surface of the wafer 1a.

The polished wafer 1a is transported to the cleaning block 8 by the robot 15, and is placed in the cleaning tank 19 of the cleaning block 8. When the cleaning is completed, the cleaned wafer 1a is placed in the drying tank 20 of the cleaning block 8 to remove the water, after which, the dried wafer 1a is taken out of the cleaning block 8 by the robot 15 to be returned to the wafer shelf 13a in the cassette. The relative position of the robot 15 with respect to the cleaning block is similarly memorized in the computer 14.

After completion of polishing of wafer 1a, each of the remaining wafers 1b-1z in the cassette 2 is individually subjected to polishing and returned one after another to the respective wafer shelf 13b-13z, the finished cassette 2 is exchanged for a unfinished cassette 2. The operational steps are performed through the device control task programs 52A-56A commanded by the respective management task programs 52-56.

There are a number of polishing parameters for producing an optimum surface finish on the wafer 1. Some of these parameters are: revolution speed and the pressing pressure of the top ring 17 on the turntable 18 to suit the type of surface film being polished; rotation speed of the turntable 18; the type of polishing cloth mounted on the turntable 18; and type of polishing solution to be supplied. Suitable polishing parameters are chosen for different types of surface films and specified for use in the polishing step. The polishing solution varies greatly depending on the type of surface film to be polished, and for example, it is close to neutral if the film is $SiO_2$, but when the film is metallic, the solution may be acidic or alkaline. Therefore, the construction materials for polishing components are specially selected for their corrosion resistance properties. The cleaning process steps also vary according to the type of surface film, and the devices are also custom constructed.

Because of these operating requirements for the polishing facility, the three standard blocks, i.e. load/unload block 5, transport block 6 and the control block 9, can be standardized and they are available in a finish assembled condition as stock items. However, the polishing block 7 and the cleaning block 8 cannot be totally standardized, because of custom component requirements depending on the type of wafers to be polished and cleaned. For this reason, these blocks are in inventory in a semi-finished condition, and the parts are made available as optional choices. Therefore, a custom polishing facility to meet specific customer needs can be manufactured from standard blocks. It is clear that inventory parts can be held to a minimum, and the overall productivity of the polishing facility is significantly improved compared with an assembly based on individual devices. It is further clear that each block is controlled through a dedicated set of hardware and software designed for the particular operational mode of each block. Optional requirements can be readily accommodated to achieve a completely standardized manufacturing of the total polishing facility.

Figure 18:
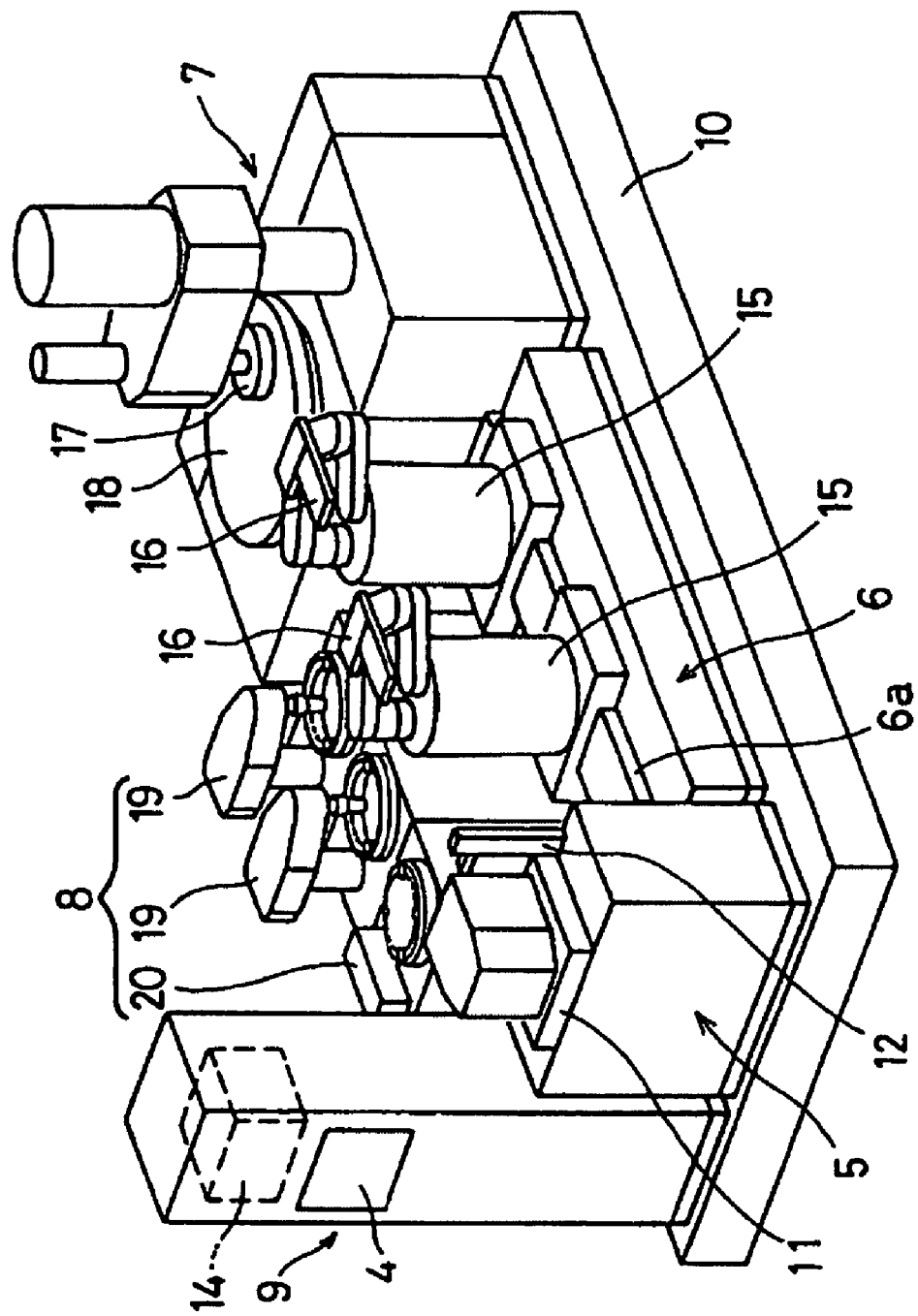
FIG. 18 is a perspective view of an embodiment provided with an extra cleaning tank and an extra robot.

FIG. 18 shows an arrangement for demonstrating a good advantage of the features of the polishing facility presented above. The new arrangement shows an addition of a cleaning tank 19 in the cleaning block to improve the cleaning capability, and an addition of a robot 15 to improve the throughput. The load/unload block 5, polishing block 7 and the control block 9 are the same as in the base model. To manufacture such an arrangement, it is only necessary to electrically assemble the load/unload block 5, the transport block 6, the polishing block 7 and cleaning block 8 to the control block 9 through their dedicated cables and signal lines. The first four blocks can be assembled mechanically and electrically as block units. After the new arrangement is decided, the new relative positions of each block is memorized in the computer. Therefore, there is no need to separately handle inter-block connections, and modifications can be carried out freely, easily and at low capital and labor investments.

Although the present invention has been described and illustrated with regard to specific features and embodiments thereof, it is to be understood that the present invention is not intended to be limited to such specifically described and illustrated features and embodiments. Rather, various modifications and changes to such specifically described and illustrated features and embodiments as would be apparent to one of ordinary skill in the art are contemplated as being within the scope of the present invention

What is claimed is:

1. A polishing apparatus for polishing a wafer to thereby flatten the wafer, said apparatus comprising:
    a load/unload block operable to receive a cassette storing a wafer therein;
    a transport block having a robot for moving the wafer;
    a polishing block having a polishing table and a top ring, said polishing block being operable to polish the surface of the wafer to thereby flatten the wafer;
    a cleaning block operable to clean the polished wafer; and
    a control block operable to memorize a first relative position of said robot of said transport block with respect to said cassette of said load/unload block through teaching and memorize a second relative position of said robot of said transport block with respect to said cleaning block,
    wherein said load/unload block, said transport block, said polishing block, and said cleaning block have control devices, respectively, which are installed independently of each other in respective blocks.

2. The polishing apparatus according to claim 1 wherein:
    said load/unload block, said transport block, said polishing block, said cleaning block, and said control block can be mechanically installed and assembled independently of each other.

3. The polishing apparatus according to claim 1, further comprising:
    at least one ancillary device selected from a group consisting of a polishing solution supply device, a waste management device, a cooling water supply device, and a warm water supply device; and
    at least one control device for connecting said ancillary device to said control block.

4. A polishing apparatus for polishing a wafer to thereby flatten the wafer, said apparatus comprising:
    a load/unload block operable to receive a cassette storing a wafer therein;
    a transport block having a robot for moving the wafer;
    a polishing block having a polishing table and a top ring, said polishing block being operable to polish the surface of the wafer to thereby flatten the wafer;
    a cleaning block operable to clean the polished wafer; and
    a control block operable to memorize a first relative position of said robot of said transport block with respect to said cleaning block through teaching and memorize a second relative position of said robot of said transport block with respect to said cassette of said load/unload block,
    wherein said load/unload block, said transport block, said polishing block, and said cleaning block have control devices, respectively, which are installed independently of each other in respective blocks.

5. The polishing apparatus according to claim 4 wherein:
    said load/unload block, said transport block, said polishing block, said cleaning block, and said control block can be mechanically installed and assembled independently of each other.

6. The polishing apparatus according to claim 4, further comprising:
    at least one ancillary device selected from a group consisting of a polishing solution supply device, a waste management device, a cooling water supply device, and a warm water supply device; and
    at least one control device for connecting said ancillary device to said control block.

* * * * *